(12) United States Patent
Zu

(10) Patent No.: US 11,835,609 B2
(45) Date of Patent: Dec. 5, 2023

(54) DOUBLE OFFSETS AND POWERS MAGNETIZATION TRANSFER RATIO FOR SPECIFIC MAGNETIZATION TRANSFER MAGNETIC RESONANCE IMAGING

(71) Applicant: Vanderbilt University, Nashville, TN (US)

(72) Inventor: ZhongLiang Zu, Nashville, TN (US)

(73) Assignee: Vanderbilt University, Nashville, TN (US)

( * ) Notice: Subject to any disclaimer, the term of this patent is extended or adjusted under 35 U.S.C. 154(b) by 0 days.

(21) Appl. No.: 17/982,190

(22) Filed: Nov. 7, 2022

(65) Prior Publication Data

US 2023/0152403 A1 May 18, 2023

Related U.S. Application Data

(60) Provisional application No. 63/279,542, filed on Nov. 15, 2021.

(51) Int. Cl.
*G01R 33/56* (2006.01)

(52) U.S. Cl.
CPC .................. *G01R 33/5605* (2013.01)

(58) Field of Classification Search
CPC .............. G01R 33/5605; G01R 33/00; G01R 33/0035; G01R 33/0023; G01R 33/0017;
(Continued)

(56) References Cited

U.S. PATENT DOCUMENTS

2013/0147477 A1 6/2013 Singh et al.
2013/0166226 A1 6/2013 Lee et al.
(Continued)

OTHER PUBLICATIONS

Scheidegger et al., "Amide Proton Transfer Imaging With Improved Robustness to Magnetic Field Inhomogeneity and Magnetization Transfer Asymmetry Using Saturation With Frequency Alternating RF Irradiation," *Magnetic Resonance in Medicine* 66:1275-1285 (2011).
(Continued)

*Primary Examiner* — Jermele M Hollington
*Assistant Examiner* — Taqi R Nasir
(74) *Attorney, Agent, or Firm* — Blank Rome LLP

(57) ABSTRACT

Imaging methods for assessing the macromolecular content, such as myelin, are of great interest for understanding brain tissue microstructure, and have shown potentials in diagnosing and prognosing demyelinating diseases. for example. Magnetization transfer (MT) is a MRI contrast mechanism that enables detection of macromolecules. Previously, the MT effect has been analyzed by a semi-quantitative method termed magnetization transfer ratio (MTR) or by a quantitative magnetization transfer (qMT) method. However, because MTR does not have enough sensitivity and specificity to myelin, and qMT takes a very long scan time, their translation into clinical scenarios has been limited. This disclosure describes a MT data analysis metric using double saturation pulse offsets and powers (dopMTR). Simulations and experiments using the systems and methods described in this disclosure show that the dopMTR yields much better sensitivity and specificity to MT effect than the conventional MTR, and requires much less scan time than the qMT.

19 Claims, 35 Drawing Sheets

(58) Field of Classification Search
CPC ............ G01R 31/3191; G01R 33/0358; G01R 33/0356; G01B 7/004; G01C 17/38; G06F 3/017; G06F 3/0346; G06F 3/012; H01L 39/223
See application file for complete search history.

(56) References Cited

U.S. PATENT DOCUMENTS

| | | | |
|---|---|---|---|
| 2019/0033412 A1* | 1/2019 | Alsop | G01R 33/5608 |
| 2019/0142297 A1* | 5/2019 | Du | A61B 5/4523 324/309 |

OTHER PUBLICATIONS

Zaiss et al., "A combined analytical solution for chemical exchange saturation transfer and semi-solid magnetization transfer," *NMR In Biomedicine*, Published online in Wiley Online Library: Dec. 15, 2014.

\* cited by examiner

DOUBLE OFFSETS AND POWERS MAGNETIZATION TRANSFER RATIO FOR SPECIFIC MAGNETIZATION TRANSFER MAGNETIC RESONANCE IMAGING

CROSS-REFERENCE TO RELATED APPLICATIONS

This patent application claims priority from the provisional patent application 63/279,542, whose content is incorporated herewith by reference.

GOVERNMENT SPONSORSHIP

This invention was made with government support under Grant Nos. EB029443, R03EB029078, and AR074261 awarded by NIH. The government has certain rights in the invention.

BACKGROUND

Magnetization transfer (MT) is a magnetic resonance imaging (MRI) contrast mechanism that enables detection of less mobile protons whose transverse relaxation time ($T_2$) is too short to be detected directly. These protons are associated with macromolecules such as myelin, membrane lipids, and large proteins in biological tissues. Changes in these macromolecules, especially the myelin, have been found in demyelinating diseases. Therefore, MT imaging can allow more accurate detection of histological changes that occur as a result of disease process than MRI structural images, and thus may be essential for diagnosing and prognosing demyelinating diseases. Previously, MT imaging has been applied to evaluate multiple neuropathologies including multiple sclerosis, Alzheimer's disease and dementia, Parkinson disease, and Traumatic Brain Injury, etc.

In MT imaging, an off-resonance RF saturation pulse is applied to saturate the macromolecular protons, and the bulk water signal is attenuated through cross relaxations with these saturated macromolecular protons. A Magnetization Transfer Ratio (MTR); defined by Eq. (1), has been used to analyze the degree of signal attenuation due to the MT effect.

$$MTR(\Delta\omega, \omega_1) = (S_0 - S(\Delta\omega, \omega_1))/S_0 \quad (1)$$

where $S_0$ and $S(\Delta\omega, \omega_1)$ are the water signals acquired without/with off-resonance RF saturation, respectively, $\Delta\omega$ is the RF frequency offset from water (Hz), and $\omega_1$ is the RF saturation power (rad/sec).

The MTR contrast has been extensively evaluated in clinical and research settings. However, although the MTR value depends on the MT effect, it is a complex combination of various parameters including the MT parameters and water relaxations. As a result, although the MIR value has been shown to be related to the extent of damage to myelin, it can be also influenced by edema and inflammation and its variation in multiple sclerosis is often small. To date, the diagnostic benefits of MTR have not been widely recognized.

To address that issue, quantitative MT (qMT), which can extract more detailed information about the MT process, has been developed and applied to improve the specificity of MT imaging to myelin. However, qMT usually needs repeated acquisition of MT signals with varied sequence parameters which is time-consuming, and also requires complex analysis. Therefore, although qMT can provide specific and sensitive MT imaging, qMT requires a much longer scan time than the conventional MTR. Thus, qMT has not been successfully translated to the clinic.

Therefore, the present disclosure relates to a method that overcomes the challenges of conventional qMT.

BRIEF SUMMARY

The various embodiments of the present disclosure relate to a method for measuring magnetization transfer (MT) of magnetic resonance (MR) signals. The method comprises providing a first MT sequence and a second MT sequence, each comprising a radiofrequency (RF) saturation block. The first MT sequence comprises a predetermined first RF saturation power and a predetermined first RF saturation frequency offset from water. The second MT sequence comprises a second RF saturation power and a second RF saturation frequency offset from water. The second RF saturation power is greater than the first RF saturation power by a factor c. Also, the second RF saturation frequency offset is greater than the first saturation frequency offset by the factor c.

The method further comprises acquiring a first MR signal and a second MR signal using the first MT sequence and the second MT sequence. The method finally comprises measuring the MT via a difference between the first MR signal and the second MR signal.

In some embodiments, the RF saturation block comprises either
(1) a single continuous wave (CW) saturation pulse followed by imaging readout;
(2) a train of shorter saturation pulses followed by imaging readout;
(3) a train of shorter saturation pulses with interleaved imaging readout; or
(4) a train of shorter saturation pulses for MT saturation followed by another train of shorter saturation pulses with interleaved imaging readout for both MT saturation and data acquisition.

In some examples, the factor c is a rational number.

In some embodiments, the method further comprises subtracting or inverse subtracting the first MR signal and the second MR signal, and determining an MT effect using the subtracting or inverse subtracting of the first MR signal and the second MR signal.

In other embodiments, determining the MT effect comprises using normalization by water longitudinal relaxation time.

DETAILED DESCRIPTION OF THE INVENTION

Figure 1:
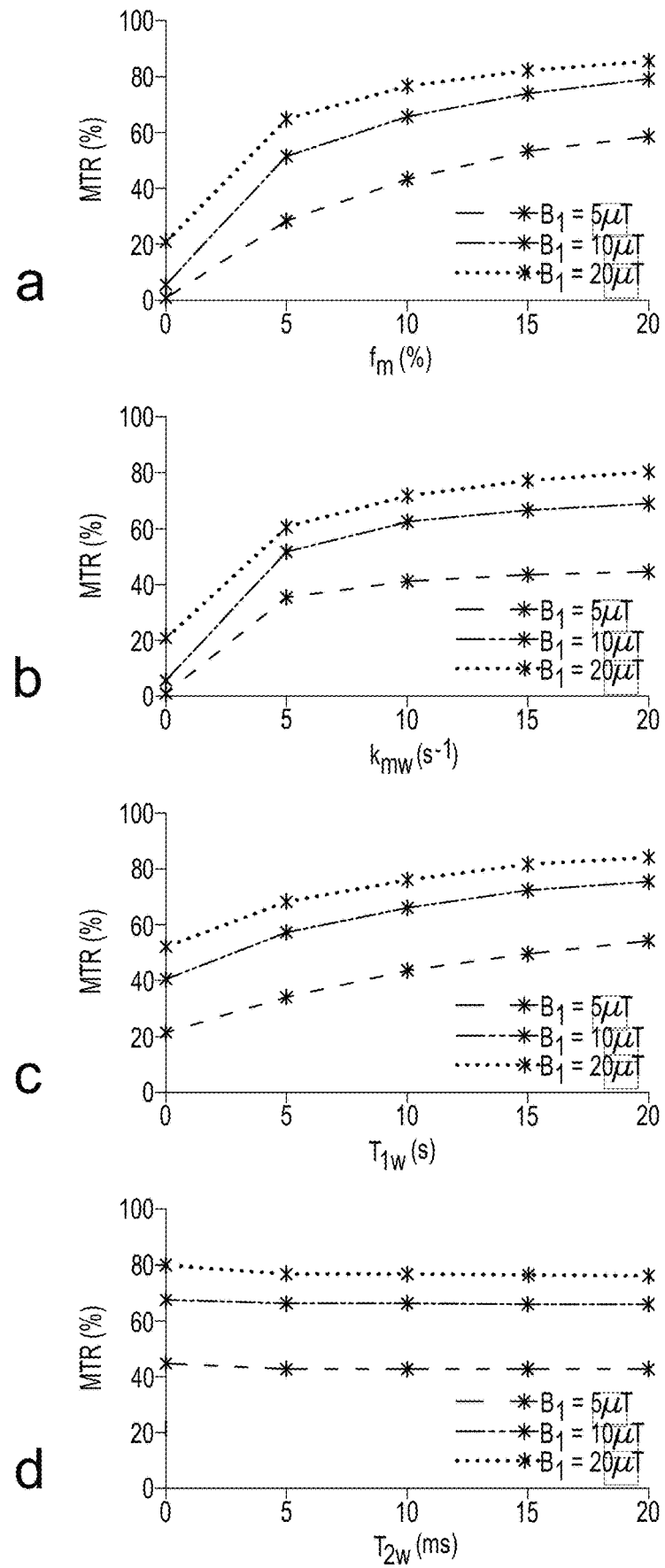
FIG. 1 shows simulations of the conventional MTR($\Delta\omega$, $\omega_1$) values as a function of fm (a), kmw (b), T1w (c), and T2w (d), using the two-pool model with $\Delta\omega$ of 8 kHz, and B1 of 5 µT, 10 µT, and 20 µT, according to one or more embodiments.

It is to be understood that the figures and descriptions of the present invention may have been simplified to illustrate elements that are relevant for a clear understanding of the present invention, while eliminating, for purposes of clarity, other elements found in a typical MR system or typical method of using an MR system. Those of ordinary skill in the art will recognize that other elements may be desirable and/or required in order to implement the present invention. However, because such elements are well known in the art, and because they do not facilitate a better understanding of the present invention, a discussion of such elements is not provided herein. It is also to be understood that the drawings included herewith only provide diagrammatic representations of the presently preferred structures of the present invention and that structures falling within the scope of the present invention may include structures different than those shown in the drawings. Reference will now be made to the drawings wherein like structures are provided with like reference designations.

This disclosure describes a method for specific and sensitive magnetization transfer (MT) magnetic resonance imaging (MRI) imaging, termed "double offsets and powers magnetization transfer ratio" (dopMTR).

This disclosure analyzes, inter alia, the reasons for the low sensitivity and low specificity of conventional M to MT effect through theoretical analysis, numerical simulations, and experiments. This disclosure then describes a MT data analysis method which improves sensitivity and specificity to MT effect than the conventional MTR method.

A conventional Novel Magnetization Transfer (NMT) could be useful in imaging brain tissue, white matter plaques, etc. The conventional NMT measures a Z-spectrum (plot of MT signals with dozens of saturation pulse frequency offsets), and then uses that Z-spectrum to model the direct water saturation (DS) effect. The conventional NMT increases the specificity of MT, but also increases the total scan time. In contrast, the dopMTR of the present disclosure doesn't need to measure the Z-spectrum and doesn't need to model the DS effect. Thus, dopMTR can increase the specificity without sacrificing the scanning time.

A conventional chemical exchange saturation transfer (CEST) imaging removes DS and MT effects. A similarity between conventional CEST imaging and the dopMTR of the present disclosure is that both these two methods use the subtraction of a label signal and a reference signal, which is a common analysis method in CEST and MT imaging. The difference is that the label signal and the reference signal are different. In the conventional CEST imaging, the label signal is the average of two MT or CEST signals acquired at two frequency offsets symmetric about water, and the reference signal is a MT or CEST signal acquired with a frequency alternating RF saturation or double frequency RF saturation. The frequency alternating RF saturation or double frequency RF saturation needs a specially designed MRI pulse sequence. The pulse sequence for the alternating RF saturation may also be checked.

In significant contrast, in the dopMTR of the present disclosure, the label signal is a MT signal acquired at a frequency offset and with a saturation power, and the reference signal is the MT signal acquired with another frequency offset and with another saturation power which have the same scaling factor. This technique is therefore an advantage of dopMTR. With this scaling factor, DS is the same, but MT is different. Subtraction of two MT signals can remove DS, while isolating part of the MT effect. DopMTR doesn't need the specially designed MRI pulse sequences that are required in conventional CEST imaging. Thus, the present disclosure describes an improved analysis method using the current MRI MT pulse sequence.

The present disclosure also includes a MT measurement method and a MT data analysis method for obtaining a specific MT effect. The MT measurement method has two MT sequences which commonly have four following variations:

1) The two MT sequences have a long (from 50 ms to 20 s) off-resonance continuous wave (CW) radiofrequency (RF) saturation block followed by an imaging readout;
2) The two MT sequences have a train of shorter (from 5 ms to 2 s) off-resonance saturation pulses followed by an imaging readout. The duration between two adjacent saturation pulses could be from 0 s to 1 s. The number of shorter saturation pulses could be from 1 to 1000. The shape of the saturation pulses could be rectangular, Gaussian, SINC, or any variation of these shapes;
3) The two MT sequences have a train of shorter off-resonance saturation pulses (from 5 ms to 2 s) with interleaved imaging readout between two adjacent saturation pulses. The duration between two adjacent saturation pulses could be from 0 s to 1 s. The number of shorter saturation pulses could be from 1 to 1000. The shape of the saturation pulses could be rectangular, Gaussian, SINC, or any variation of these shapes; or
4) The two MT sequences have a train of shorter off-resonance saturation pulses (from 5 ms to 2 s) for the saturation of macromolecular pool followed by another train of shorter off-resonance saturation pulses (from 5 ms to 2 s) with interleaved imaging readout between two adjacent saturation pulses for both the saturation of macromolecular pool and data acquisition. The duration between the two adjacent saturation pulses could be from 0 s to 1 s. The number of shorter saturation pulses could be from 1 to 1000. The shape of the saturation pulses could be rectangular, Gaussian, SINC, or any variation of these shapes.

Embodiments of the disclosure can be applied to any of the above MT sequences by changing their power and offset and using the data analysis method.

The first MT sequence will be performed with a certain RF saturation power and a certain RF saturation frequency offset from water. The second MT sequence will be performed with a RF saturation power and a RF saturation frequency offset that are c times of those in the first MT sequence, in which c is the same for the RF saturation power and the RF saturation frequency offset and could be any rational number. The MT data analysis method could be the subtraction of the two MR signals or the inverse subtraction of the two MR signals acquired with these two MT sequences to reduce the DS effect. The subtraction of these two MR signals can remove most of the DS effect, and the inverse subtraction of these two MR signals can remove all the DS effect. The subtraction or the inverse subtraction of the two MR signals acquired with these two MT sequences could be also normalized by water longitudinal relaxation time (T1w) to remove the contamination from T1w.

Thus, as described more fully below, improved features and techniques involving the MR signals include:
1) Improved measurements of the MR signals with double RF frequency offsets and saturation powers; and
2) Improved data analysis method using the subtraction or the inverse subtraction of the MR signals acquired with the double RF frequency offsets and saturation powers, as well as using the normalization of water longitudinal relaxation time (T1w).

1. THEORY

The Bloch equations calculate the nuclear magnetization as a function of relaxation time. A two-pool (water pool and macromolecular pool) coupled Bloch equation describes the MT effect. The solution for that two-pool model is derived as, $$\frac{S(\Delta\omega, \omega_1)}{S_o} = \frac{\frac{1}{T_{1m}}(f_m k_{mw} T_{1w}) + W(\Delta\omega, \omega_1) + \frac{1}{T_{1m}} + k_{mw}}{(f_m k_{mw} T_{1W})\left(W(\Delta\omega, \omega_1) + \frac{1}{T_{1m}}\right) + \left[1 + \left(\frac{\omega_1}{2\pi\Delta\omega}\right)^2\left(\frac{T_{1w}}{T_{2W}}\right)\right]\left(W(\Delta\omega, \omega_1) + \frac{1}{T_{1m}} + k_{mw}\right)} \quad (2)$$

in which $f_m$, $k_{mw}$, $T_{1w}$ ($1/R_{1w}$), $T_{2w}$ ($1/R_{2w}$), and Tim are the macromolecular pool size ratio, exchange rate from the macromolecular pool to the water pool, water longitudinal relaxation time, water transverse relaxation time, and macromolecular pool longitudinal relaxation time. W(Aa), Wi)

is the saturation rate of the macromolecular pool, which depends on the absorption line shape of the macromolecular pool.

The two-pool coupled Bloch equation with RF saturation applied along the x-axis are given by:

$$\frac{dM}{dt} = A \cdot M \quad \text{Eq. (A1)}$$

where $$M = [M_{wx}(t), M_{wy}(t), M_{wz}(t), M_{mz}(t), 1]^T$$

$$A = \begin{bmatrix} -R_{2w} & -\Delta\omega & 0 & 0 & 0 \\ \Delta\omega & -R_{2w} & \omega_1 & 0 & 0 \\ 0 & -\omega_1 & -R_{1w} - f_m \cdot k_{mw} & k_{mw} & R_{1w} \\ 0 & 0 & f_m \cdot k_{mw} & -R_{1m} - k_{mw} - W & R_{1m} \cdot f_m \\ 0 & 0 & 0 & 0 & 0 \end{bmatrix}$$

where the subscripts w and m denote the water pool and macromolecular pool, respectively. $W = \omega_1^2 \pi g_m(\Delta\omega)$, with $\omega_1$ in rads/sec and $\Delta\omega$ in Hz. $g_m$ is a super-Lorentzian absorption line shape in biological tissues and a Gaussian absorption line shape in gel samples (e.g. cross-linked BSA).

$$g_m(\Delta\omega) = \int_0^{\frac{\pi}{2}} \sin\theta \sqrt{\frac{2}{\pi}} \frac{T_{2m}}{|3\cos^2\theta - 1|} \exp\left\{-2\left[\frac{2\pi\Delta\omega T_{2m}}{3\cos^2\theta - 1}\right]^2\right\} d\theta \quad \text{Eq. (A2)}$$

$$g_m(\Delta\omega) = \frac{T_{2m}}{\sqrt{2\pi}} \exp\left\{\frac{(-2\pi\Delta\omega T_{2m})^2}{2}\right\} \quad \text{Eq. (A3)}$$

where $T_{2m}$ is the macromolecular pool transverse relaxation time.

The solution of Eq. (A1) can be given by $$M(t) = e^{At} M(0) \quad \text{Eq. (A4)}$$

where $M(0)$ is the matrix of initial values at $t=0$, which is equal to $[0\ 0\ M_{0,wz}\ M_{0,mz}\ 1]^T$. $e^{At}$ can be computed using diagonalization.

Eq. (2) can be rewritten as:

$$\frac{S(\Delta\omega, \omega_1)}{S_0} = \frac{\frac{1}{T_{1m}}(f_m k_{mw} T_{1w}) + W(\Delta\omega, \omega_1) + \frac{1}{T_{1m}} + k_{mw}}{(f_m k_{mw} T_{1w})\left(W(\Delta\omega, \omega_1) + \frac{1}{T_{1m}}\right) -} = \quad (3)$$

$$\left[1 + \left(\frac{\omega_1}{2\pi\Delta\omega}\right)^2 \left(\frac{T_{1w}}{T_{2w}}\right)\right] \frac{1}{T_{1m}}(f_m k_{mw} T_{1w}) +$$

$$\left[1 + \left(\frac{\omega_1}{2\pi\Delta\omega}\right)^2 \left(\frac{T_{1w}}{T_{2w}}\right)\right]$$

$$\left(\frac{1}{T_{1m}}(f_m k_{mw} T_{1w}) + W(\Delta\omega, \omega_1) + \frac{1}{T_{1m}} + k_{mw}\right)$$

$$\frac{1}{(f_m k_{mw} T_{1w}) + \left(W(\Delta\omega, \omega_1) + \frac{1}{T_{1m}}\right) -}$$

$$\frac{1 + \left(\frac{\omega_1}{2\pi\Delta\omega}\right)^2 \left(\frac{T_{1w}}{T_{2w}}\right) \frac{1}{T_{1m}}(f_m k_{mw} T_{1w})}{\frac{1}{T_{1m}}(f_m k_{mw} T_{1w}) + W(\Delta\omega, \omega_1) + \frac{1}{T_{1m}} + k_{mw}} +$$

$$\left[1 + \left(\frac{\omega_1}{2\pi\Delta\omega}\right)^2 \left(\frac{T_{1w}}{T_{2w}}\right)\right]$$

$$\frac{1}{f_m k_{mw} T_{1w} \frac{W(\Delta\omega, \omega_1) - \left(\frac{\omega_1}{2\pi\Delta\omega}\right)^2 \left(\frac{T_{1w}}{T_{2w}}\right) \frac{1}{T_{1m}}}{\frac{1}{T_{1m}}(f_m k_{mw} T_{1w}) + W(\Delta\omega, \omega_1) + \frac{1}{T_{1m}} + k_{mw}}} + \left[1 + \left(\frac{\omega_1}{2\pi\Delta\omega}\right)^2 \left(\frac{T_{1w}}{T_{2w}}\right)\right]} =$$

$$\frac{R_{1w}}{f_m k_{mw} \frac{W(\Delta\omega, \omega_1) - \left(\frac{\omega_1}{2\pi\Delta\omega}\right)^2 \left(\frac{T_{1w}}{T_{2w}}\right) \frac{1}{T_{1m}}}{\frac{1}{T_{1m}}(f_m k_{mw} T_{1w}) + W(\Delta\omega, \omega_1) + \frac{1}{T_{1m}} + k_{mw}}} + \left[\frac{1}{T_{1m}} + \left(\frac{\omega_1}{2\pi\Delta\omega}\right)^2 \left(\frac{1}{T_{2w}}\right)\right]} = \frac{R_{1w}}{R_{1w} + MT + DS}$$

where the first term in the denominator is related to MT effect, and the second term in the denominator is related to DS effect, Here, $R_{MT}$ is used to descript this MT effect and $R_{DS}$ to descript the DS effect, $$R_{MT}(\Delta\omega, \omega_1) = f_m k_{mw} \frac{W(\Delta\omega, \omega_1) - \left(\frac{\omega_1}{2\pi\Delta\omega}\right)^2 \left(\frac{T_{1w}}{T_{2w}}\right) \frac{1}{T_{1m}}}{\frac{1}{T_{1m}}(f_m k_{mw} T_{1w}) + W(\Delta\omega, \omega_1) + \frac{1}{T_{1m}} + k_{mw}} \quad (4)$$

$$R_{DS}(\Delta\omega, \omega_1) = \left(\frac{\omega_1}{2\pi\Delta\omega}\right)^2 \left(\frac{1}{T_{2W}}\right) \quad (5)$$

Calculations in FIGS. 12-15 show that (1) $R_{MT}$ is proportional to $f_m$ and increases non-linearly with $k_{mw}$; (2) $R_{MT}$ is roughly insensitive to $T_{1w}$ and $T_{2w}$ when its value is not too low. This feature suggests that $R_{MT}$ can represent specific MT effect.

By substituting Eq. (3) into Eq. (1), the conventional MTR can be derived, $$MTR(\Delta\omega, \omega_1) = 1 - \frac{R_{1w}}{R_{1w} + R_{MT}(4\omega, \omega_1) + R_{DS}(\Delta\omega, \omega_1)} \quad (6)$$

Note that (1) the MTR should not be proportional to $R_{MT}$ and thus not $f_m$, even if there is no DS effect ($R_{DS}=0$); (2) the MTR has a complex dependence on $R_{1w}$ through both the $R_{1w}$ in the numerator and $R_{DS}$, which cannot be easily removed. Here, an improved metric is defined, termed double offsets and powers magnetization transfer ratio (dopMTR) in Eq. (7), which is the inverse subtraction of two MT signals acquired at two sets of sequence parameters including ($\Delta\omega$, $\omega_1$) and ($c\Delta\omega$, $c\omega_1$) together with $T_{1w}$ normalization (c is a constant).

Additionally, according to Eq. (5), $R_{DS}(\Delta\omega, c\omega_1) = R_{DS}(c\Delta\omega, c\omega_1)$. Eq. (7) can then be derived as, $$dopMTR(\Delta\omega, \omega_1) = \quad (7)$$

$$\left|\frac{S_0}{S(\Delta\omega, \omega_1)} - \frac{S_0}{S(c\Delta\omega, c\omega_1)}\right| R_{1w} = |R_{1w} + R_{DS}(\Delta\omega, \omega_1) +$$

$$R_{MT}(\Delta\omega, \omega_1) - (R_{1w} + R_{DS}(c\Delta\omega, c\omega_1) + R_{MT}(c\Delta\omega, c\omega_1))| =$$

$$|R_{MT}(\Delta\omega, \omega_1) - R_{MT}(c\Delta\omega, c\omega_1)|$$

By choosing appropriate $\Delta\omega$, $\omega_1$, and c so that $R_{MT}(\Delta\omega, \omega_1)$ is different from $R_{MT}(c\Delta\omega, c\omega_1)$, the dopMTR can isolate the whole or a part of the specific MT effect from the DS effect.

2. MATERIALS AND METHODS

2.1 Simulations

MT signals were simulated using Eq. (A4) with saturation time (t) of 5 s. To study the MT Z-spectra, the conventional MTR spectra, and the dopMTR spectra, a two-pool model simulated $S(c\Delta\omega, c\omega_1)$ was obtained with $\Delta\omega$ varying from 1 kHz to 15 kHz, $B_1$ ($\omega_1=2\pi\gamma B_1$, $\gamma$ is the gyromagnetic ratio and is 42.6 Hz/µT) of 5 µT, 10 µT, and 20 µT, and c of 1-6. To study the DS spectra, a single-pool model simulated $S(c\Delta\omega, c\omega_1)$ with variation in these sequence parameters was also obtained by setting $f_m$ to 0 in Eq. (A4). The sample parameters included $f_m$ of 10%, $k_{mw}$ of 25 s$^{-1}$, $T_{1w}$ of 1.5 s, $T_{2w}$ of 60 ms, $T_{1m}$ of 1 s, and $T_{2w}$ of 15 µs. The macromolecular line shape was a super-Lorentzian function, except where noted. To study the dependence of the conventional MTR values and the dopMTR values on sample parameters, we varied $f_m$ (0, 5, 10, 15, 20%), $k_{mw}$ (0, 10, 20, 30, 40 s$^{-1}$), $T_{1w}$ (0.5, 1, 1.5, 2.0, 2.5 s), and $T_{2w}$ (20, 40, 60, 80, 100 s). Each parameter was varied individually, with all other sample parameters remained at the above values used for simulating the MT spectra.

2.2 Phantom and Animal Preparation

A series of cross-linked bovine serum albumin (BSA) samples served as test samples for evaluating the specificity of the conventional MTR and the dopMTR methods. Three samples were made of 5% (sample #1), 10% (sample #2), and 15% (sample #3) (w/w) BSA in Phosphate-buffered Saline (PBS) with pH of 7.0.0.075 mM MnCl$_2$ was added to these three samples to vary its water relaxations. These three samples have different $f_m$ ($R_{1w}$ is also different due to the different $f_m$), and were used to study the dependence of the two MT analysis methods on $f_m$. Additional three samples were made of 0.05 mM (sample #4), 0.075 mM (sample #5), and 0.1 mM (sample #6) MnCl$_2$ in PBS with pH of 7.0. BSA was added to these thse samples to reach 10% (w/w) in each sample. These three samples have different $R_{1w}$ but the same $f_m$, and were used to study the dependence of the two MT analysis methods on $R_{1w}$. All samples were cross-linked using 25% glutaraldehyde, and were kept at room temperature for 24 h for crosslinking before measurement. A water sample with 0.075 mM MnCl$_2$ in PBS with pH of 7.0 was also prepared to study the DS effect. Table 1, below, lists the qMT determined sample parameters of these six BSA samples and the water sample.

TABLE 1 qMT determined sample parameters on BSA sample #1-6 and the water sample.

|  | $f_m$ (%) | $k_{mw}$ (s$^{-1}$) | $R_{1w}$ (s$^{-1}$) |
|---|---|---|---|
| Sample #1 | 5.66 | 37.23 | 0.63 |
| Sample #2 | 8.58 | 37.55 | 0.71 |
| Sample #3 | 10.95 | 35.87 | 0.79 |
| Sample #4 | 8.67 | 37.94 | 0.61 |
| Sample #5 | 7.93 | 34.51 | 0.67 |
| Sample #6 | 8.57 | 27.88 | 0.75 |
| Water sample | — | — | 0.81 |

Three rats were immobilized and anesthetized with a 2%/98% isoflurane/oxygen mixture during data acquisition. Respiration was monitored to be stable, and a constant rectal temperature of 37° C. was maintained throughout the experiments using a warm-air feedback system (SA Instruments, Stony Brook, NY, USA).

2.3 MRI

All measurements were performed on a Varian Direct-Drive™ horizontal 4.7 T magnet with a 38-mm Litz RF coil (Doty Scientific Inc. Columbia, SC, USA). The MT sequence contains a 5 s continuous wave saturation pulse followed by an imaging readout. $S(c\Delta\omega, c\omega_1)$ was obtained with $\Delta\omega$ varying from 1 kHz to 15 kHz, B1 of 5 µT, 10 µT, and 20 µT, and several c values. (c=6 for $B_1$ of 20 µT in the phantoms, c=6 for $B_1$ of 10 µT and all c values for $B_1$ of 20 µT in the animals were not measured due to the high specific absorption rate). So was obtained by setting $\Delta\omega$ to 100 kHz. For comparison with the conventional MTR and dopMTR methods, qMT determined sample parameters including $f_m$, $k_{mw}$, and $R_{1w}$ were also obtained. The qMT imaging was performed using a selective inversion recovery (SIR) method with inversion times of 4, 5, 6, 8, 10, 12, 15, 20, 50, 200, 500, 800, 1000, 2000, 4000, and 6000 ms. After the inversion pulse in this SIR-qMT imaging, the measured water signal vs. the recovery time is a bi-exponential function caused by the magnetization transfer between the macromolecular pool and water pool. By fitting the measured water signals to this bi-exponential function of the inversion time, both the MT parameters ($f_m$, $k_{mw}$) and $R_{1w}$ can be obtained. All images were obtained by a single-shot spin-echo Echo-planar Imaging (SE-EPI) acquisition with slice thickness of 2 mm and matrix size of 96×96 for the animal imaging and 64×64 for the phantom imaging. The field of view (FOV) is 30 mm×30 mm for the animal imaging and 35 mm×35 mm for the phantom imaging, respectively. The number of average is 1 for the conventional MT and dopMTR, and is 5 for the SIR-qMT.

2.4 Data Analysis

All data analyses were performed using MATLAB R2018a.

3. RESULTS

3.1 Simulations

FIG. 1 shows the simulations of the conventional MTR ($\Delta\omega$, $\omega_1$) values as a function of sample parameters including $f_m$, $k_{mw}$, $T_{1w}$, and $T_{2w}$. It was found that the conventional MTR values non-linearly depend on $f_m$, $k_{mw}$, and $T_{1w}$. When $f_m$ was increased from 5% to 15% (3 times), the conventional MTR value was only increased from 64% to 83% (1.3 times), suggesting that the sensitivity of the conventional MTR method to $f_m$ was low. The dependence of the conventional MTR values on $T_{1w}$ is also weak. However, given its weak dependence on $f_m$, this weak dependence on $T_{1w}$ may still reduce the specificity of the conventional MTR to the MT effect.

Figure 2:
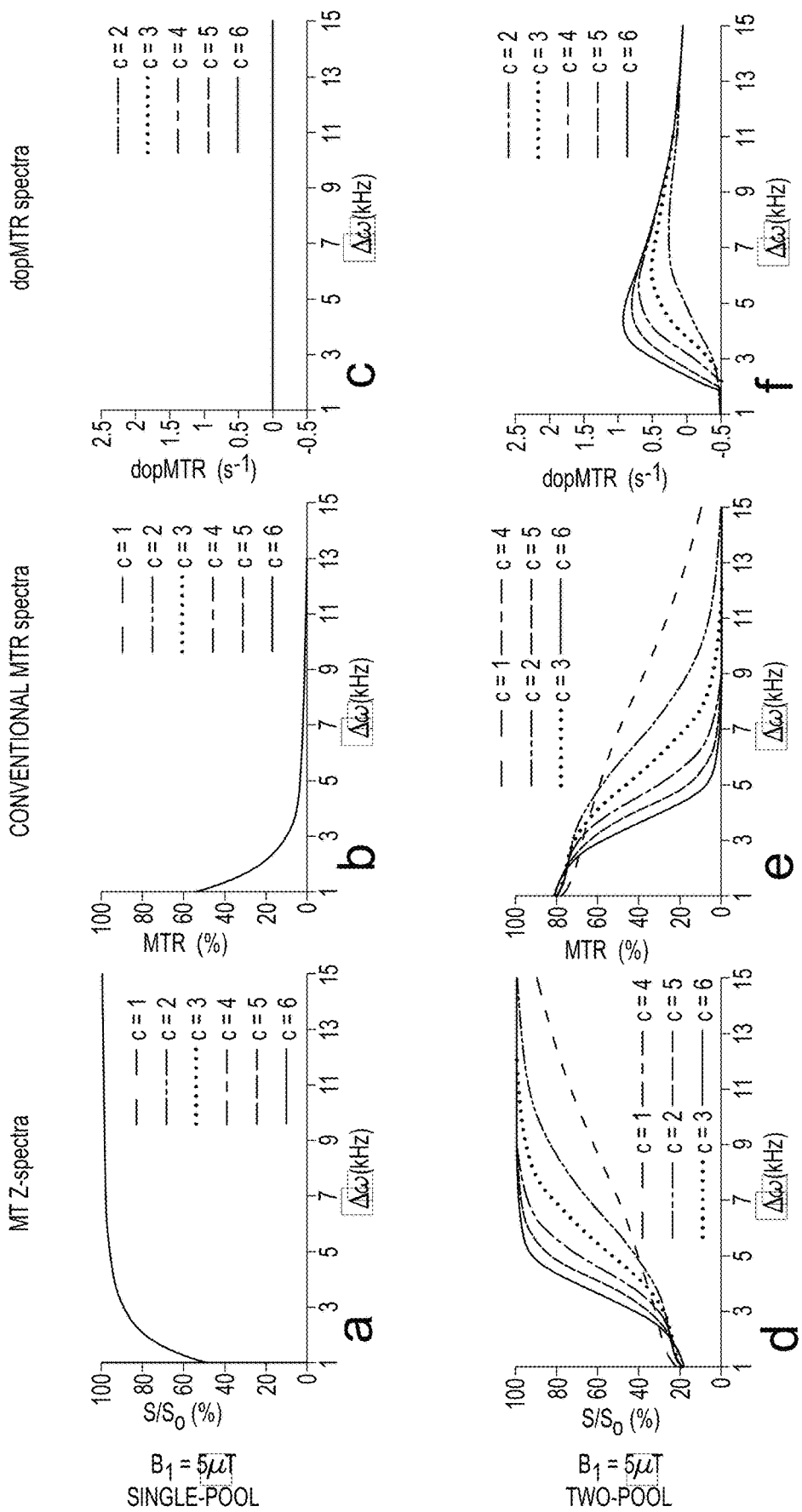
FIG. 2 shows simulations of MT Z-spectra (a, d, g, j, m, p), conventional MTR spectra (b, e, h, k, n, q), and dopMTR spectra (c, f, i, l, o, r) using the single-pool model (a, b, c, g, h, l, m, n, o) and the two-pool model (d, e, f, j, k, l, p, q, r) with B1 of 5 µT (a-f), 10 µT (g-l), and 20 µT (m-r). The different color of the MT Z-spectra, MTR spectra, and dopMTR spectra represent $S(c\Delta\omega, c\omega 1)/S_0$, MTR($c\Delta\omega$, $c\omega 1$), and dopMTR($c\Delta\omega$, $c\omega 1$), respectively, with different c values. The curves with different color in the single-pool model simulations overlap, according to one or more embodiments.
Figure 2:
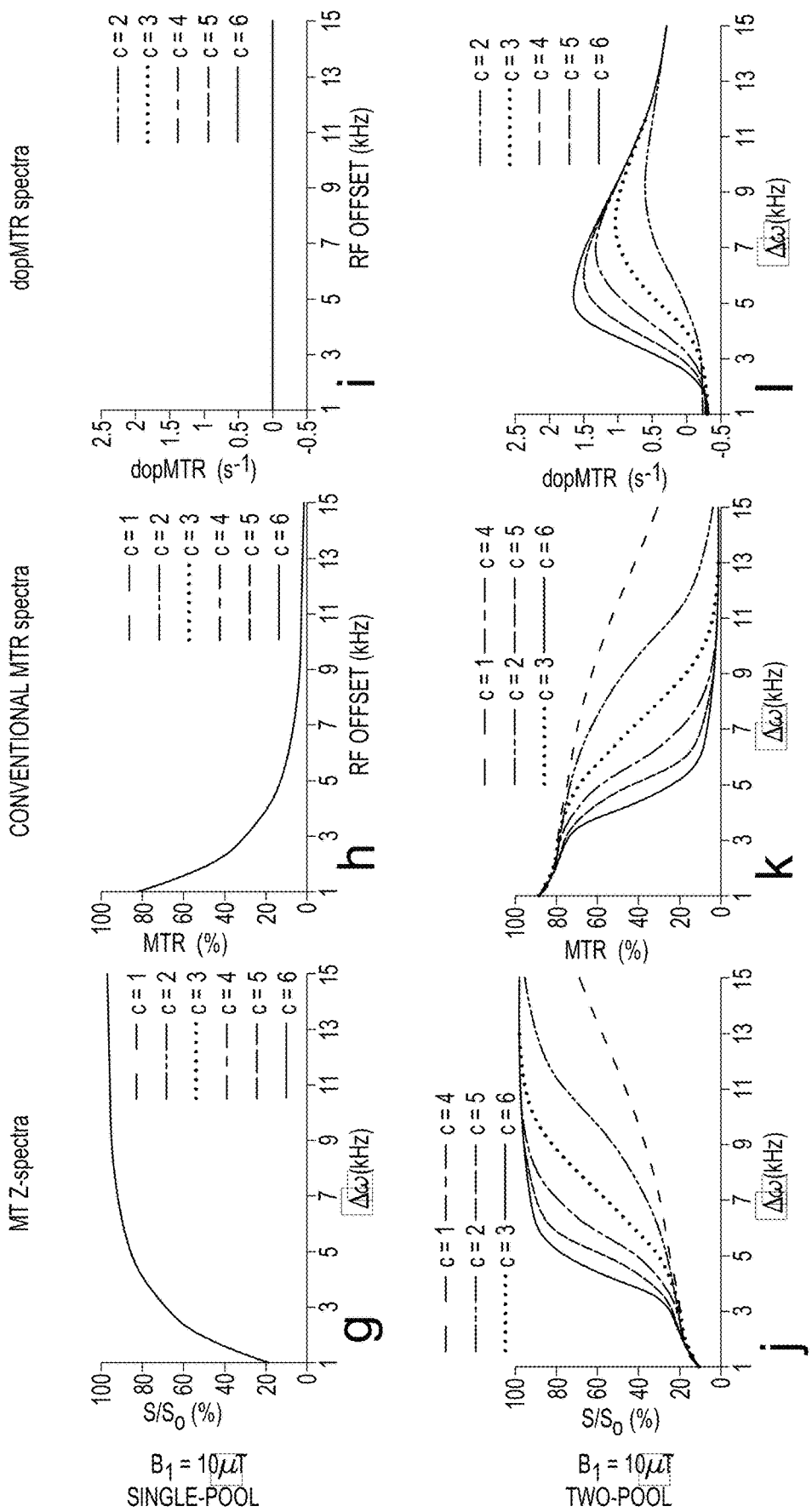
Figure 2:
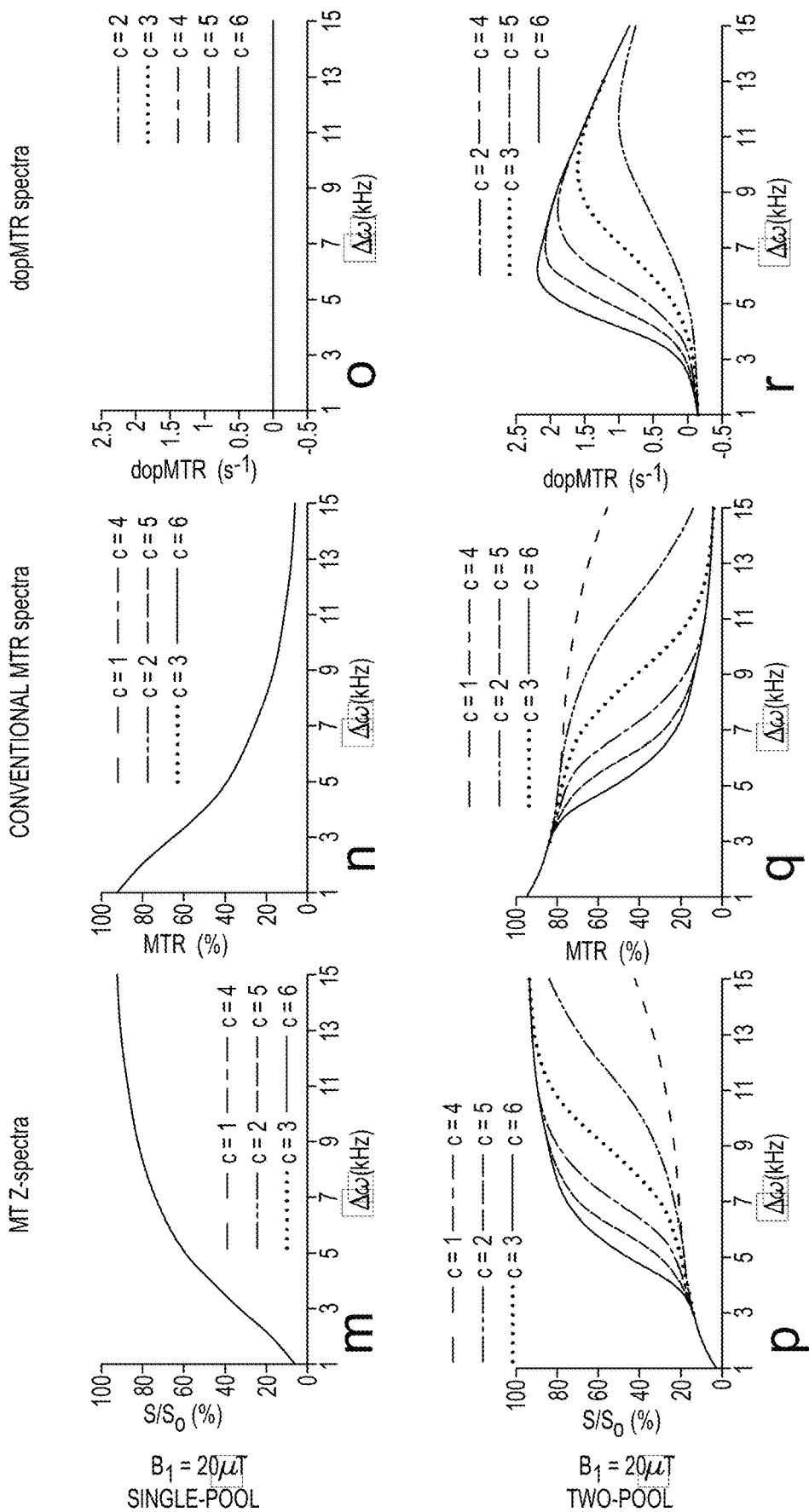

FIG. 2 shows the single-pool model and the two-pool model simulated MT Z-spectra, conventional MTR spectra, and dopMTR spectra. These spectra were shown in the form of $S(c\Delta\omega, c\omega_1)/S_0$, MTR($c\Delta\omega, c\omega_1$), and dopMTR($c\Delta\omega, c\omega_1$) with a variety of c values. Note that the single-pool model simulated MT Z-spectra (see FIGS. 2a, 2g, and 2m) are independent of c values, suggesting that the DS effect can be removed by the dopMTR (see FIGS. 2c, 2i, and 2o). In contrast, the two-pool model simulated MT Z-spectra (see FIGS. 2d, 2j, and 2p) are reduced with higher c values (except that with c value of 1 and $B_1$ of 5 µT at low $\Delta\omega$ in FIG. 2d), suggesting that the whole or a part of the MT effect can be isolated by the dopMTR (see FIGS. 2f, 2l, and 2r).

Also note that the conventional MTR cannot remove the DS effect (see FIGS. 2b, 2h, and 2n).

Figure 3:
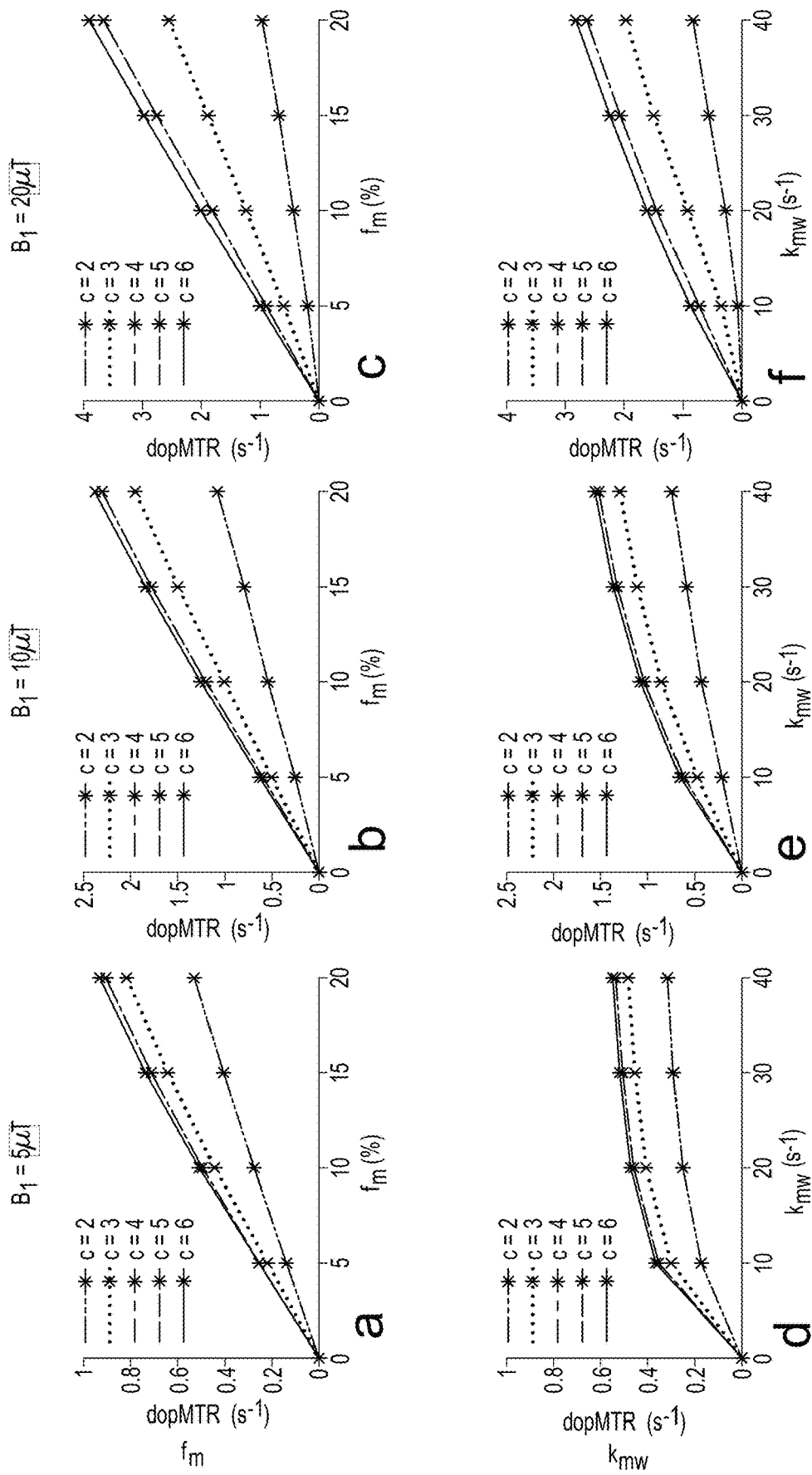
FIG. 3 shows two-pool model simulated dopMTR(c$\Delta\omega$, c$\omega$1) values as a function of fm (a, b, c), kmw (d, e, f), T1w (g, h, i), and T2w (j, k, l) with $\Delta\omega$ of 8 kHz and B1 of 5 µT, 10 µT, and 20 µT, according to one or more embodiments.
Figure 3:
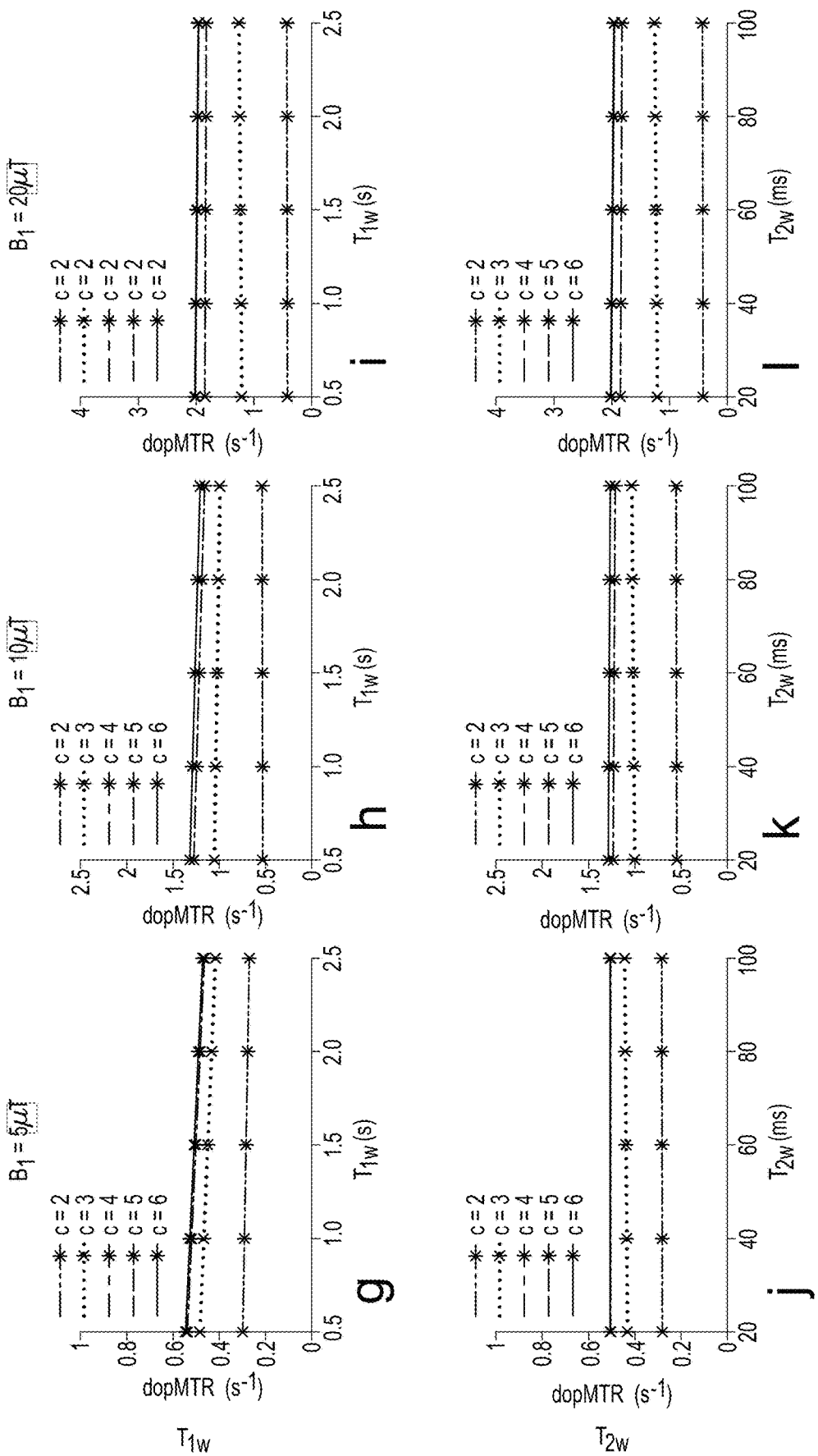

FIG. 3 shows the simulated dopMTR(c$\Delta\omega$, c$\omega_1$) values with $\Delta\omega$ of 8 kHz and $B_1$ of 5 µT, 10 µT, and 20 µT as a function of sample parameters including $f_m$, $k_{mw}$, $T_{1w}$, and $T_{2w}$. Note that the dopMTR value is proportional to $f_m$, non-linearly increases with $k_{mw}$, and roughly independent of $T_{1w}$ and $T_{2w}$, which shows improved specificity and sensitivity to MT effect compared with the conventional MTR method.

3.2 Phantom Studies

Figure 4:
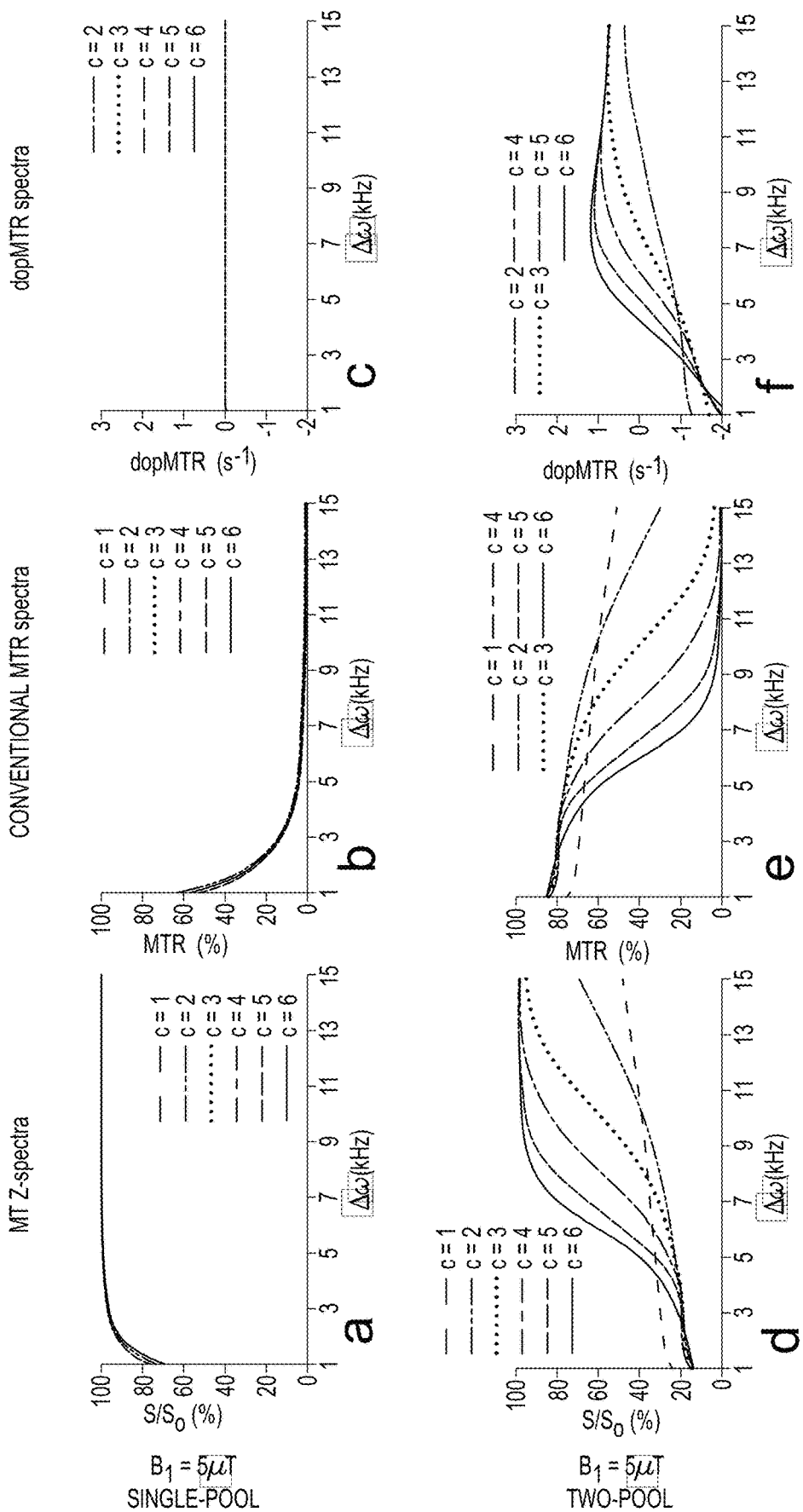
FIG. 4 shows measured MT Z-spectra (a, d, g, j, m, p), conventional MTR spectra (b, e, h, k, n, q), and dopMTR spectra (c, f, i, l, o, r) on the water phantom (a, b, c, g, h, l, m, n, o) and a BSA phantom (10% w/w, sample #2) (d, e, f, j, k, l, p, q, r) with B1 of 5 µT (a-f), 10 µT (g-1), and 20 µT (m-r). The different color of the MT Z-spectra, MTR spectra, and dopMTR spectra represent S(c$\Delta\omega$, c$\omega$1)/S$_0$, MTR(c$\Delta\omega$, c$\omega$1), and dopMTR(c$\Delta\omega$, c$\omega$1), respectively, with different c values. The curves with different color in the single-pool model simulations overlap, according to one or more embodiments.
Figure 4:
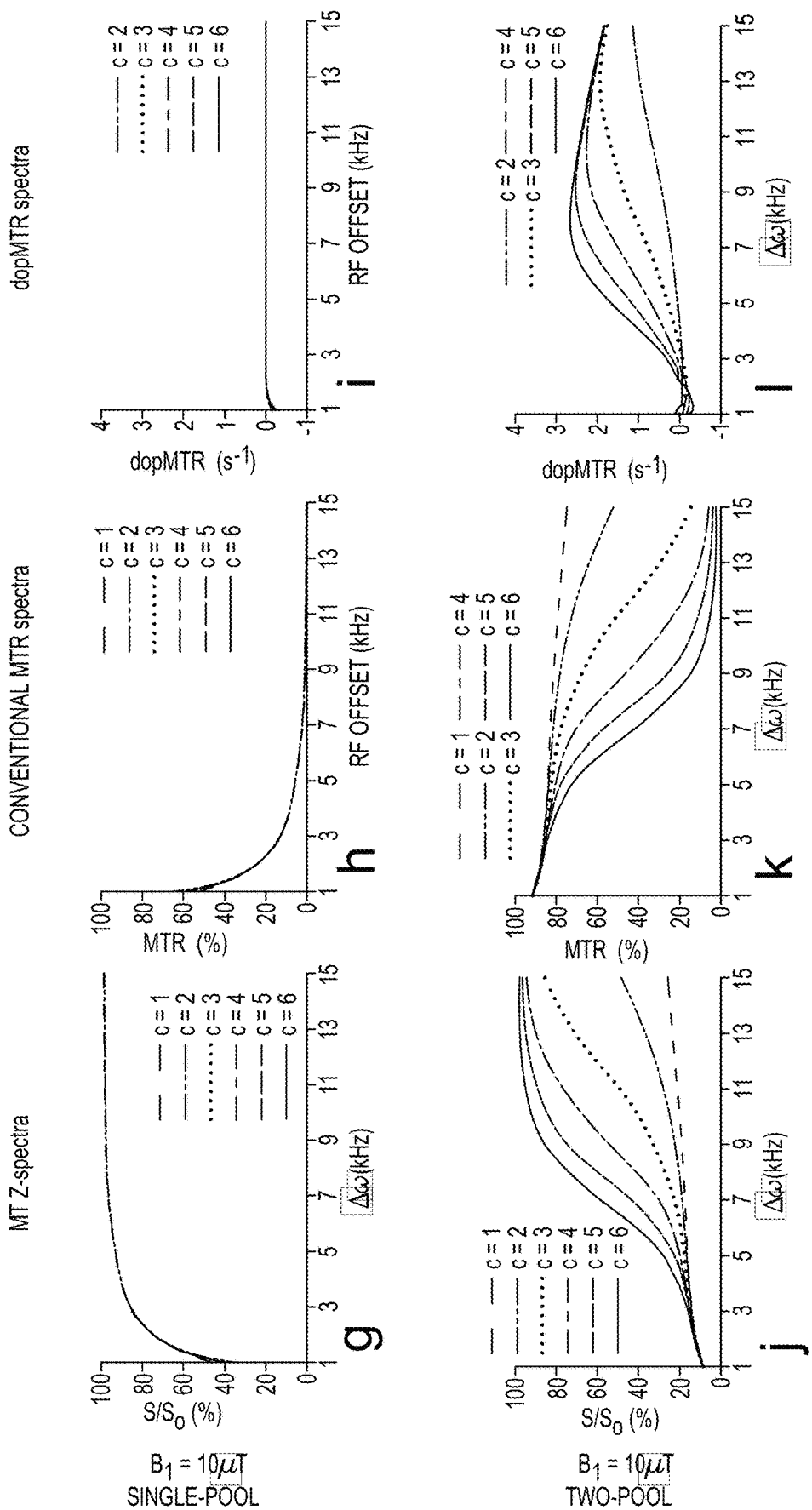
Figure 4:
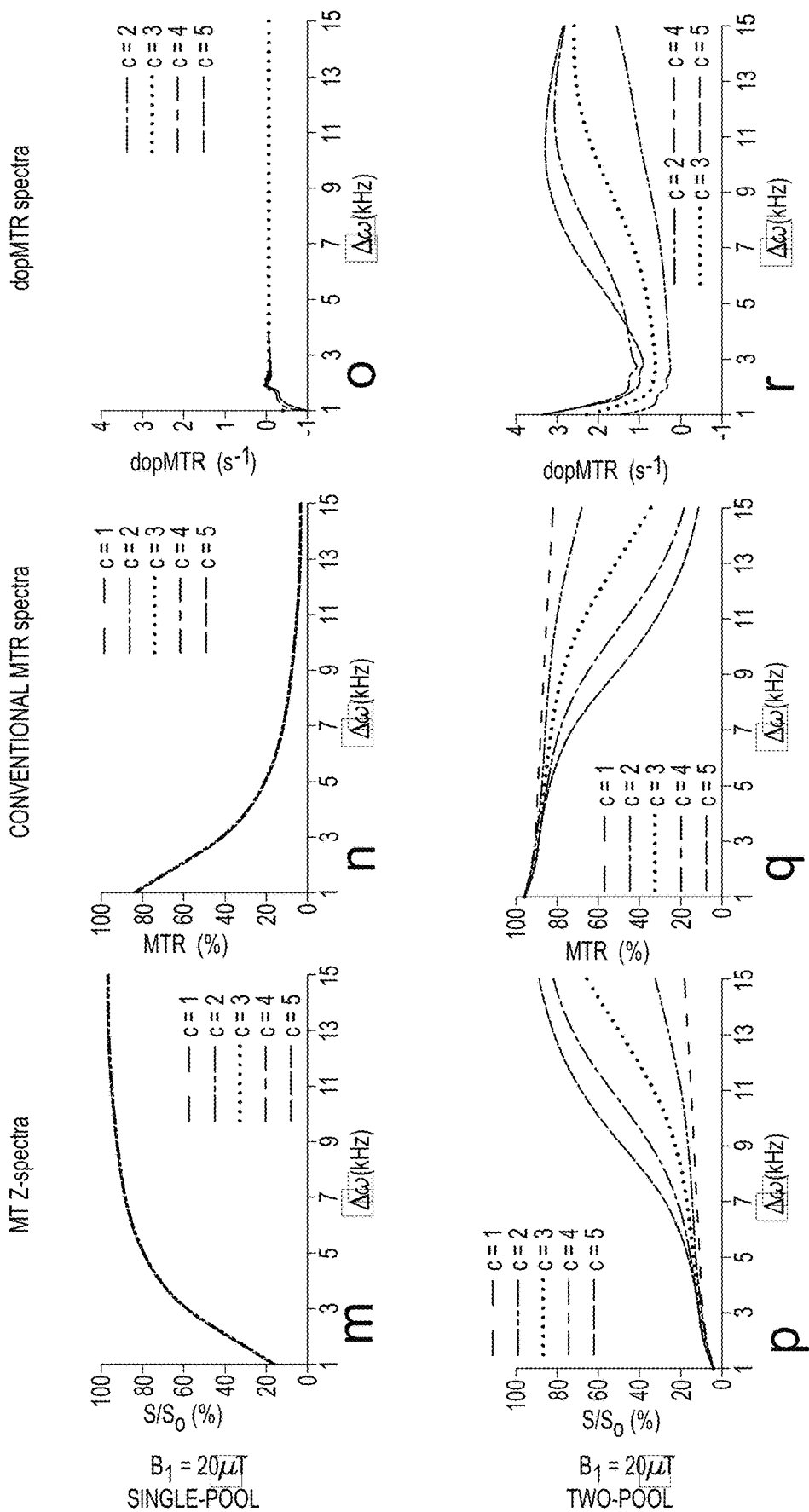

FIG. 4 shows the MT Z-spectra, conventional MTR spectra, and dopMTR spectra measured on a BSA sample (sample #2) and the water sample with a variety of c values. These spectra are shown in the form of S(c$\Delta\omega$, c$\omega_1$)/$S_0$, MTR(c$\omega$, c$\omega_1$), and dopMTR(c$\Delta\omega$, c$\omega_1$) with a variety of c values. Note that MT Z-spectra from the water sample (see FIGS. 4a, 4g, and 4m) are independent of c values, confirming the above simulations in FIG. 2 that the DS effect can be removed by the dopMTR (see FIGS. 4c, 4i, and 4o). Also note that the MT Z-spectra from the BSA sample (see FIGS. 4d, 4j, and 4p) are reduced with higher c values (except that with c value of 1 and $B_1$ of 5 µT at relatively low $\Delta\omega$ in FIG. 4d), confirming the above simulations in FIG. 2 that the whole or a part of the MT effect can be isolated by the dopMTR (see FIGS. 4f, 4l, and 4r). However, the conventional MTR cannot remove the DS effect (see FIGS. 4b, 4h, and 4n), confirming the above simulations in FIG. 2.

Figure 5:
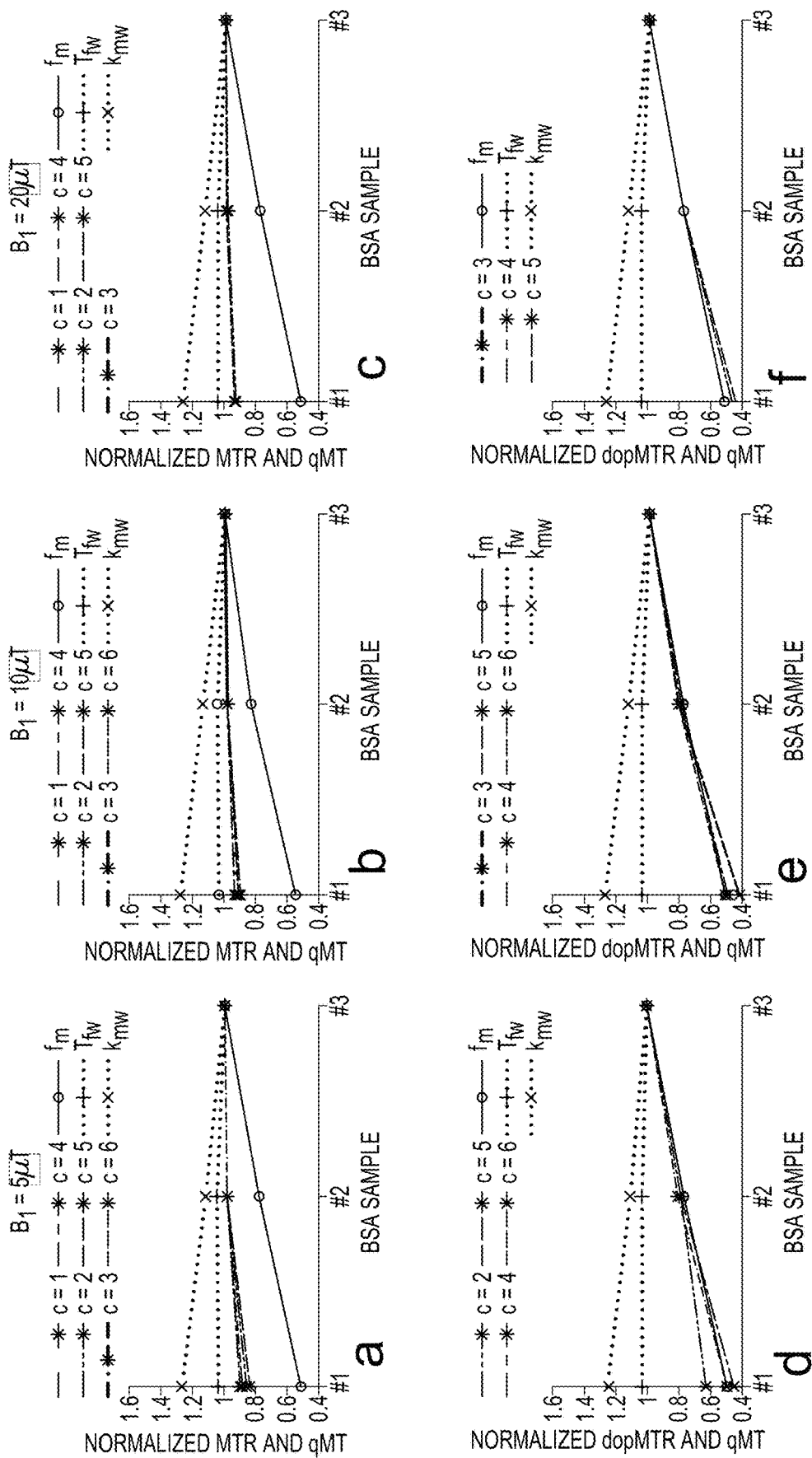
FIG. 5 shows normalized MTR(c$\Delta\omega$, c$\omega$1) values (a-c, g-i) and normalized dopMTR(c$\Delta\omega$, c$\omega$1) values (d-f, j-l) on a series of BSA phantoms with different BSA concentrations but the same MnCl2 concentration (BSA samples #1-3) (a-f) and different MnCl2 concentrations but the same BSA concentration (BSA samples #1-5) (g-l)) with $\Delta\omega$ of 8 kHz and B1 values of 5 µT, 10 µT and 20 µT. Normalized qMT-determined fm, kmw, and T1w were also plotted for comparison with the normalized MTR and the normalized dopMTR, according to one or more embodiments.
Figure 5:
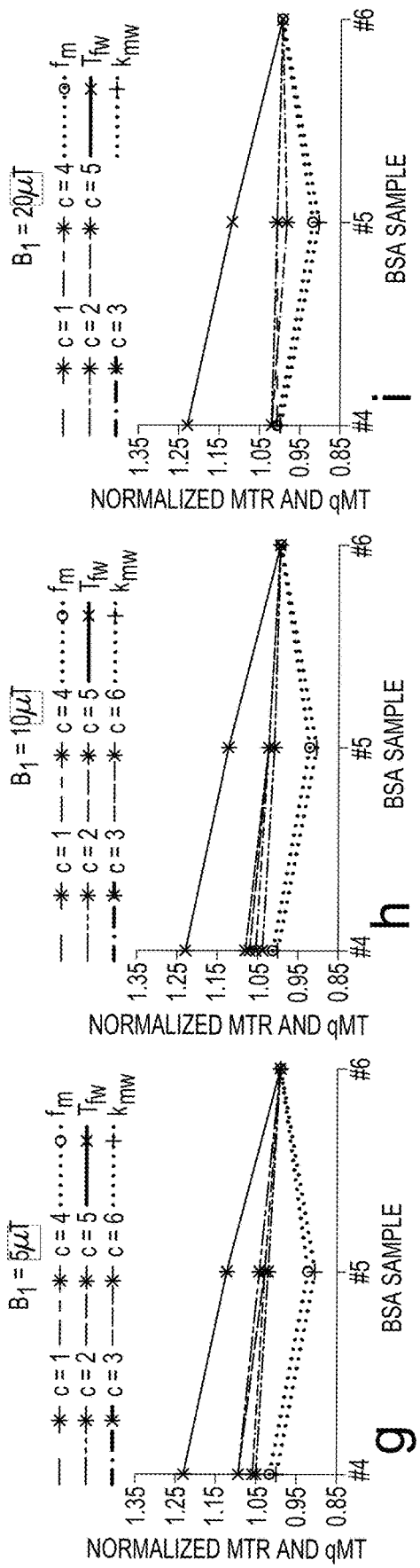
Figure 5:
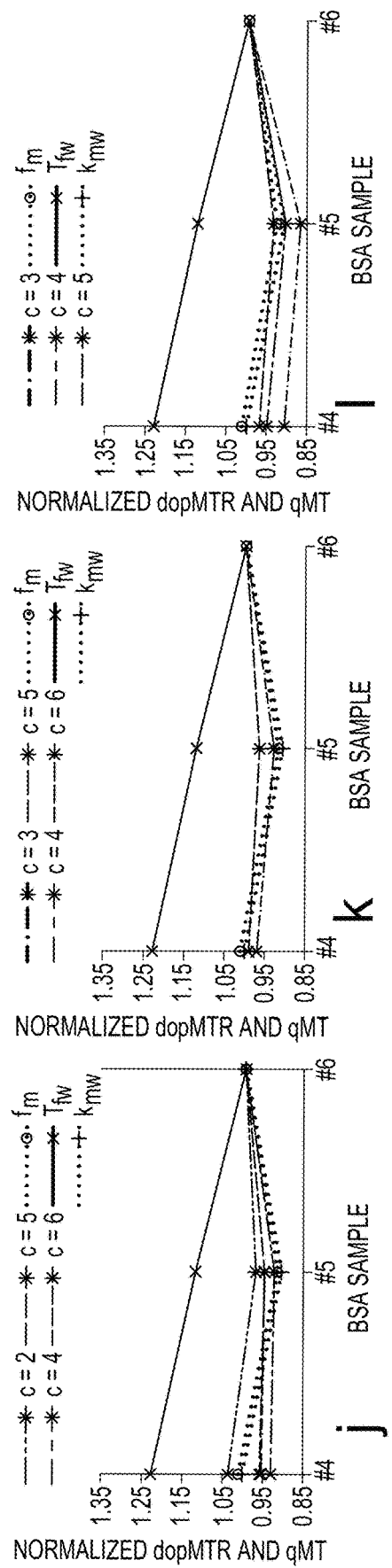

FIG. 5 shows the normalized MTR(c$\Delta\omega$, c$\omega_1$) values, the normalized dopMTR(c$\Delta\omega$, c$\omega_1$) values, and the normalized qMT determined sample parameters on the three BSA samples with different concentration of BSA and on the three BSA samples with different concentration of $MnCl_2$. The normalization was performed by dividing their values from the three samples with the value from the last sample (sample #3 in FIGS. 5a-5f and sample #6 in FIGS. 5g-5l) so that these metrics and parameters can be drawn in the same FIG. and be easily compared. Note in FIGS. 5a-5c that although the qMT determined $f_m$ increases greatly from sample #1 to sample #3 (the qMT-determined $k_{mw}$ is nearly unchanged), the conventional MTR value only has a small variation, confirming the above simulations in FIG. 1a that the sensitivity of MTR to MT effect is relatively low. In contrast, the dopMTR value is roughly proportional to the qMT determined $f_m$, confirming the above simulations in FIGS. 3a-3c that the dopMTR has increased sensitivity to the MT effect. Additionally, note in FIG. 5g-5i that the variation of the conventional MTR value follows a roughly similar trend to the qMT-determined $T_{1w}$, which decreases from sample #1 to sample #3, suggesting that the conventional MTR value is influenced more by $T_{1w}$ than by the MT effect. In contrast, the dopMTR value in FIGS. 5j-5l shows a roughly similar trend to the qMT determined $f_m$ and $k_{mw}$, suggesting that it has more influence from the variation in the MT effect. This confirms the above simulations in FIGS. 3g-3i that the dopMTR value is relatively insensitive to $T_{1w}$. The normalized dopMTR values with c of 3 for an of 5 µT, and with c of 2 for on of 10 µT and 20 µT, respectively, were not shown because they deviates greatly from the normalized qMT determined $f_m$. This deviation is due to the small difference between S($\Delta\omega$, on)/$S_0$ and S(2$\Delta\omega$, 2$\omega_1$)/$S_0$ at $\Delta\omega$ of 8 kHz as shown in FIGS. 4d, 4j, and 4p.

Figure 6:
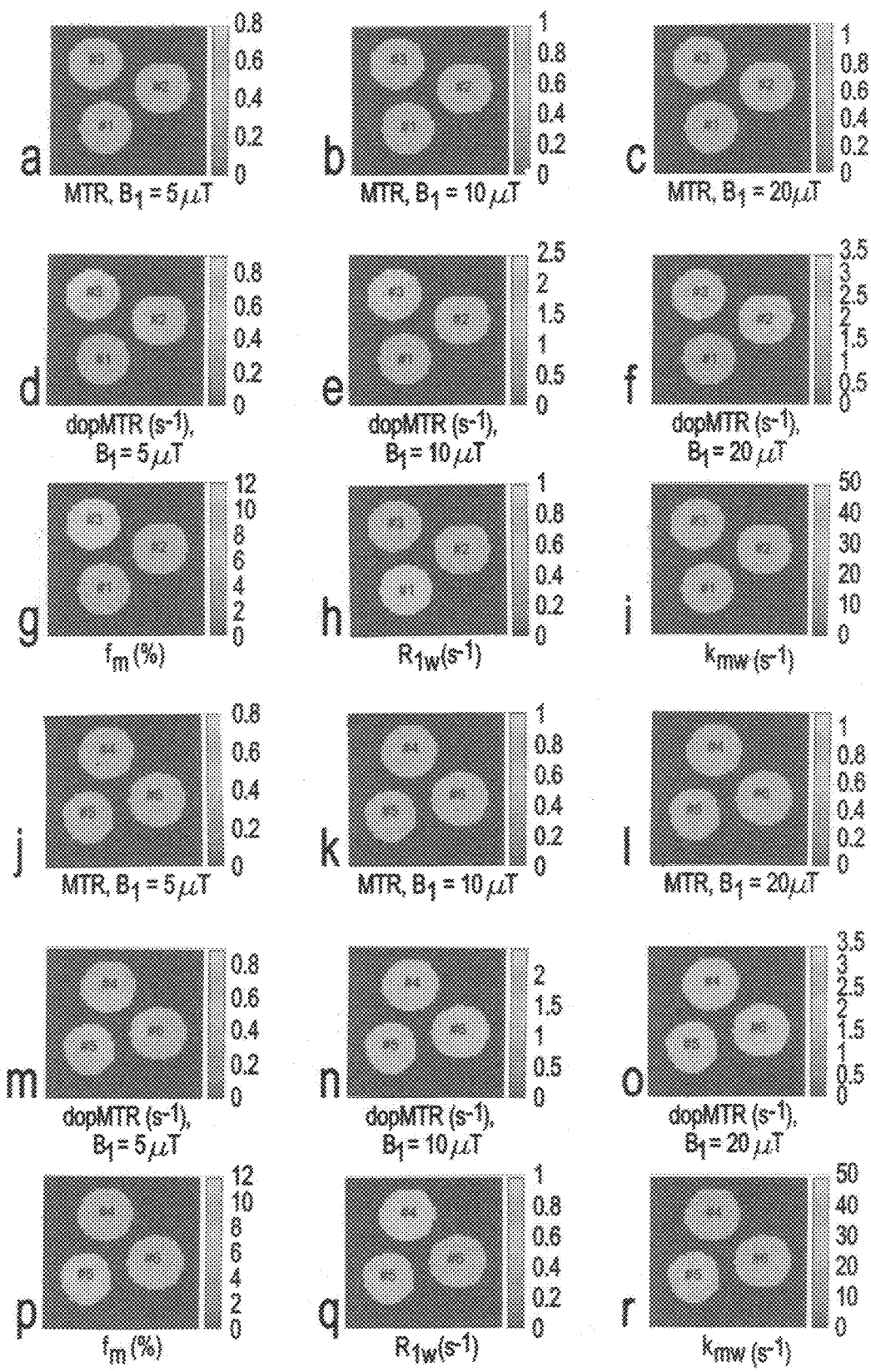
FIG. 6 shows images of the conventional MTR(c$\Delta\omega$, c$\omega$1) (a-c, j-l) and the dopMTR(c$\Delta\omega$, c$\omega$1) (d-f, m-o) with $\Delta\omega$ of 8 kHz, B1 of 5 µT, 10 µT and 20 µT, and c of 4, as well as qMT determined fm, R1w, kmw (g-l, p-r) on BSA sample #1-3 (a-i) and BSA sample #1-6 (j-r), according to one or more embodiments.

FIG. 6 shows the images of the conventional MTR(c$\Delta\omega$, c$\omega_1$) and dopMTR(c$\Delta\omega$, c$\omega_1$) with $\Delta\omega$ of 8 kHz, $B_1$ of 5 µT, 10 µT and 20 µT, and c of 4, as well as the qMT determined $f_m$, $R_{1w}$, $k_{mw}$ on BSA samples #1-6. Note that the contrast among samples #1-3 in the images of dopMTR is similar to the image of qMT determined $f_m$, suggesting that the dopMTR may replace the qMT but with significantly reduced imaging time. In contrast, nearly no contrast can be observed in the images of the conventional MTR. Also note that the contrast among samples #1-6 can be observed in the image of the qMT determined $R_{1w}$, but not in the image of the dopMTR.

3.3 Animal Studies

Figure 7:
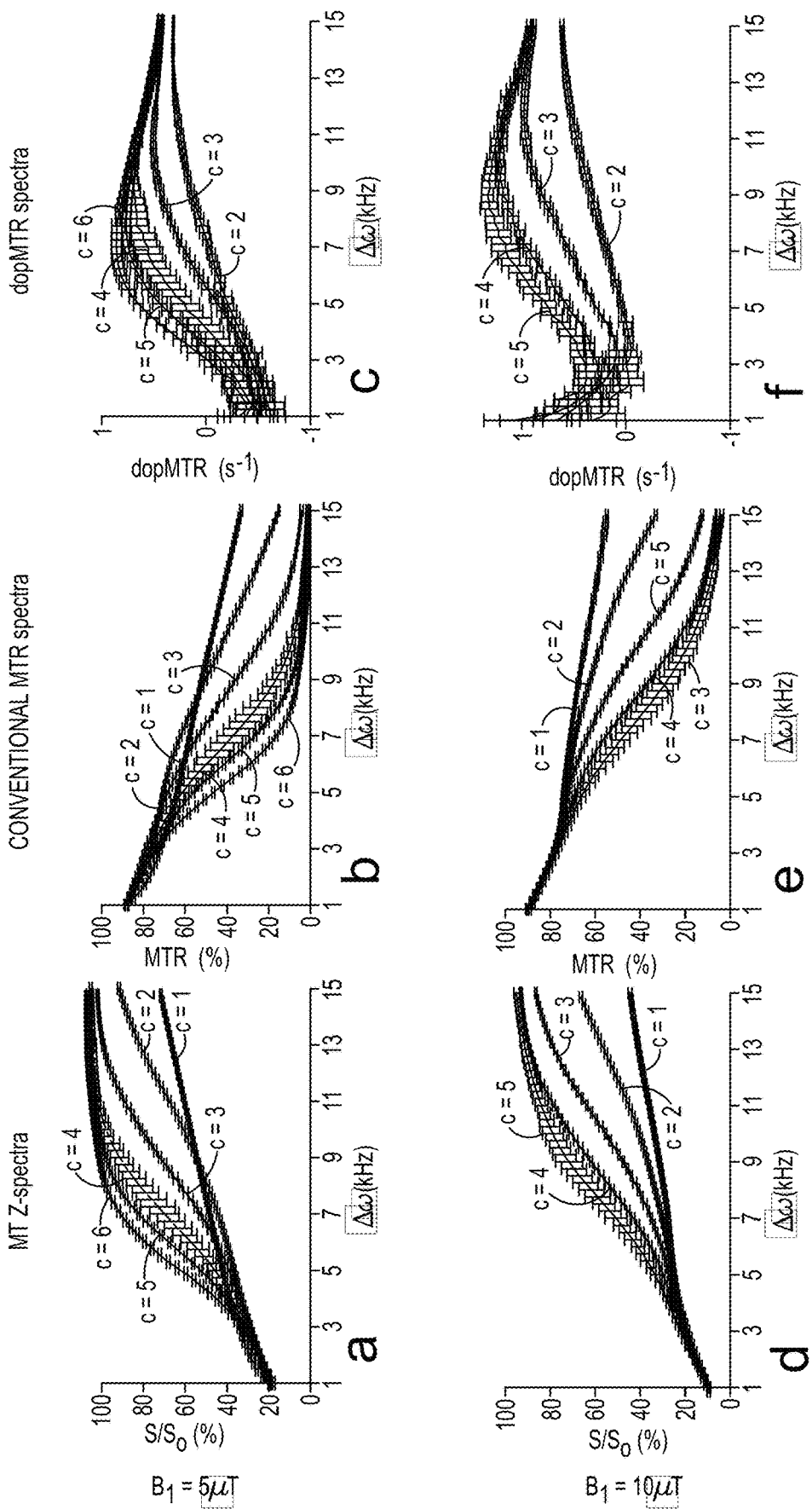
FIG. 7 shows measured MT Z-spectra (a, d), conventional MTR spectra (b, e), and dopMTR spectra (c, f) from the GM of 4 healthy rat brains, according to one or more embodiments.

FIG. 7 shows the MT Z-spectra, conventional MTR spectra, and dopMTR spectra for various c values from the GM of 4 healthy rat brains. These spectra are shown in the form of S(c$\Delta\omega$, c$\omega_1$)/$S_0$, MTR(c$\Delta\omega$, c$\omega_1$), and dopMTR (c$\Delta\omega$, c$\omega_1$) for various c values. The animal experiments produced similar results to the simulations and phantom experiments.

Figure 8:
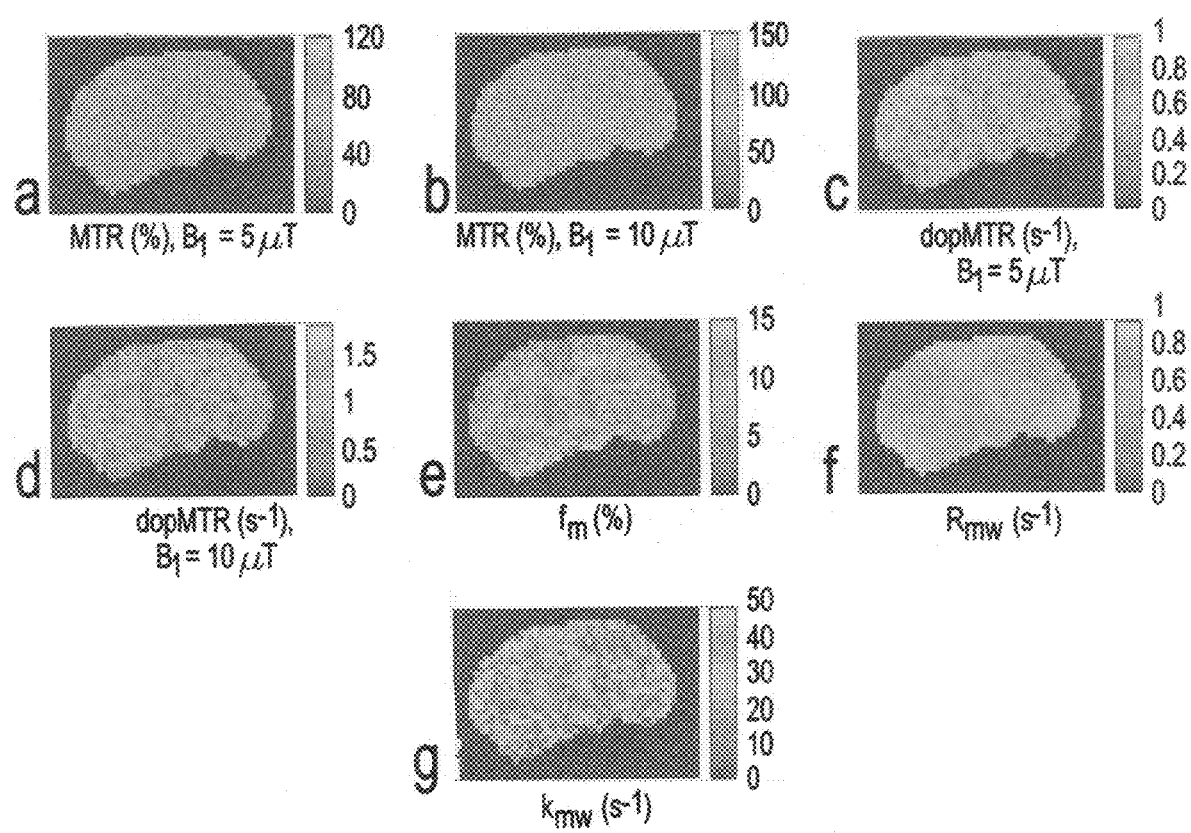
FIG. 8 shows images of the conventional MTR($\Delta\omega$, c$\omega$1) (a-b) and the dopMTR(c$\Delta\omega$, c$\omega$1) (c-d) with Aw of 8 kHz, B1 values of 5 µT and 10 µT, and c value of 4, as well as qMT-determined fm, R1w, kmw (e-g) on a representative rat brain, according to one or more embodiments.

FIG. 8 shows the images of the conventional MTR(c$\Delta\omega$, c$\omega_1$), dopMTR(c$\Delta\omega$, c$\omega_1$), and the qMT determined $f_m$, $R_{1w}$, $k_{mw}$ on a representative rat brain. Note that white matter (WM) can be clearly observed in the images of dopMTR in FIG. 8c and FIG. 8d and qMT determined $f_m$ in FIG. 8e, but not in the conventional MTR in FIG. 8a and FIG. 8b.

4. DISCUSSION

MT signals usually have contributions from both MT effect and DS effect. Ideally, a reference signal containing the same DS effect, but no or a part of MT effect, should be obtained, and subtracted to the MT signal to isolate the whole or a part of MT effect from the DS effect. However, it is challenging to find an accurate reference signal in MT imaging. Instead, the conventional MTR uses the subtraction of a control signal acquired without saturation and a MT signal. Our analysis in Eq. (6) shows that the conventional MIR cannot remove the DS effect. Also, we find that the conventional MTR has a complex dependence on the MT effect defined by $R_{MT}$, resulting in the non-linear dependence on $f_m$ and the reduced sensitivity to $f_m$. Furthermore, we find that the conventional MTR has a complex dependence on $T_{1w}$ which cannot be easily removed.

Eq. (5) shows that $R_{DS}$ remains constant when $\Delta\omega$ and on are changed in the same proportion, i.e. $R_{DS}(\Delta\omega, \omega_1)=R_{DS}$ (c$\Delta\omega$, c$\omega_1$). In contrast, Eq. (4) shows that $R_{MT}$ cannot remain constant when $\Delta\omega$ and on are changed in the same proportion, i.e. $R_{MT}(\Delta\omega, \omega_1)$ $R_{MT}$(c$\Delta\omega$, c$\omega_1$). Thus, MT signal measured with c$\Delta\omega$ and con can be used as a reference signal, whereas MT signal measured with $\Delta\omega$ and on can be used as a label signal, for analyzing the MT effect. Eq. (3) shows that the MT signal inversely depends on the sum of MT effect and DS effect. So the inverse subtraction of the reference signal and the label signal, defined in Eq. (7), can isolate the whole or a part of MT effect from the DS effect. After removing DS effect, $R_{1w}$ can be easily removed by normalizing $T_{1w}$. This inverse relationship between the MT signal and the MT and DS effects can be also derived from the Eigenspace solution of Bloch equations, which has been applied to remove DS and MT effects in chemical exchange saturation transfer (CEST) imaging. Although our simulations and experiments focus on the inverse subtraction of label and reference signals which can fully remove the DS effect suggested by Eq. (7), subtraction of the label and reference signals|S(c$\Delta\omega$, c$\omega_1$)/$S_0$−$S_0$($\Delta\omega$, $\omega_1$)/$S_0$|$R_{1w}$ can be alternatively used to remove most of the DS effect.

Figure 16:
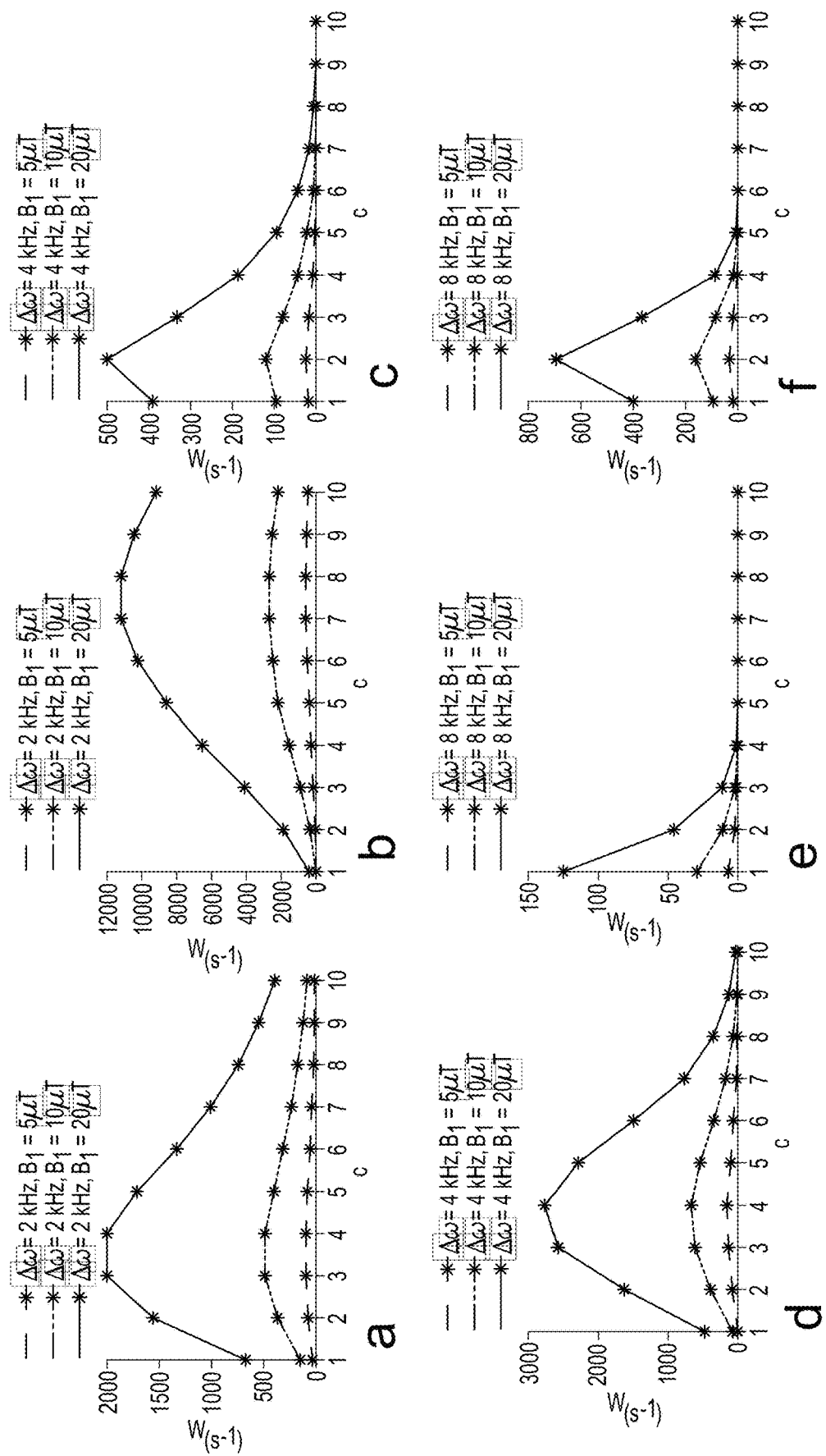
FIG. 16 shows calculated W(c$\Delta\omega$, c$\omega$1) vs. c with $\Delta\omega$ of 2 kHz, 4 kHz, and 8 kHz, as well as B1 of 5 µT, 10 µT, and 20 µT for each $\Delta\omega$. Plots in (a, c, e) were calculated with the super-Lorentzian line shape, and plots in (b, d, f) were calculated with the Gaussian line shape, according to one or more embodiments.
Figure 17:
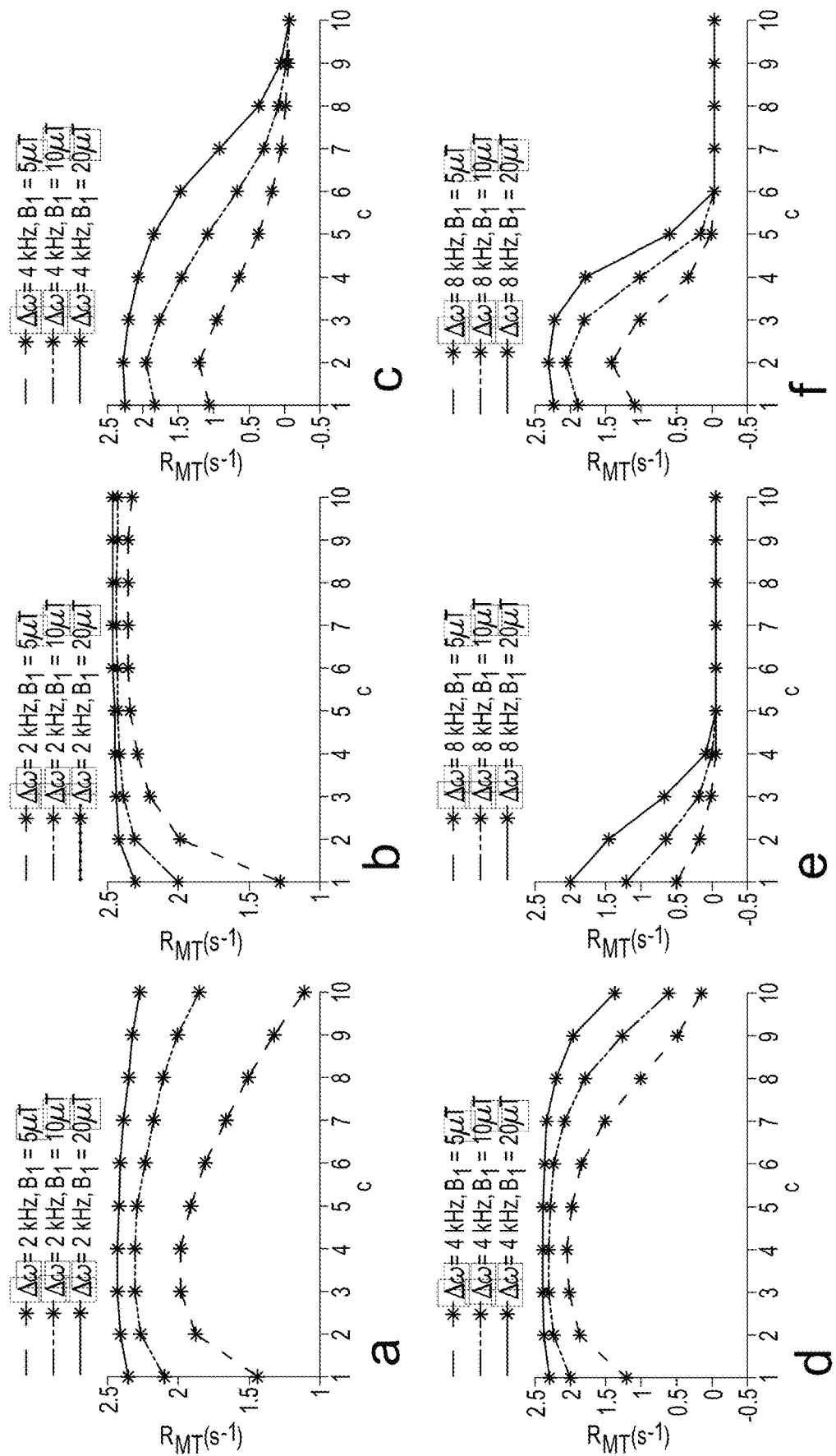
FIG. 17 shows calculated RMT(c$\Delta\omega$, c$\omega$1) vs. c with $\Delta\omega$ of 2 kHz, 4 kHz, and 8 kHz, as well as B1 of 5 µT, 10 µT, and 20 µT for each $\Delta\omega$. Plots in (a, c, e) were calculated with the super-Lorentzian line shape, and plots in (b, d, f) were calculated with the Gaussian line shape, according to one or more embodiments.
Figure 18:
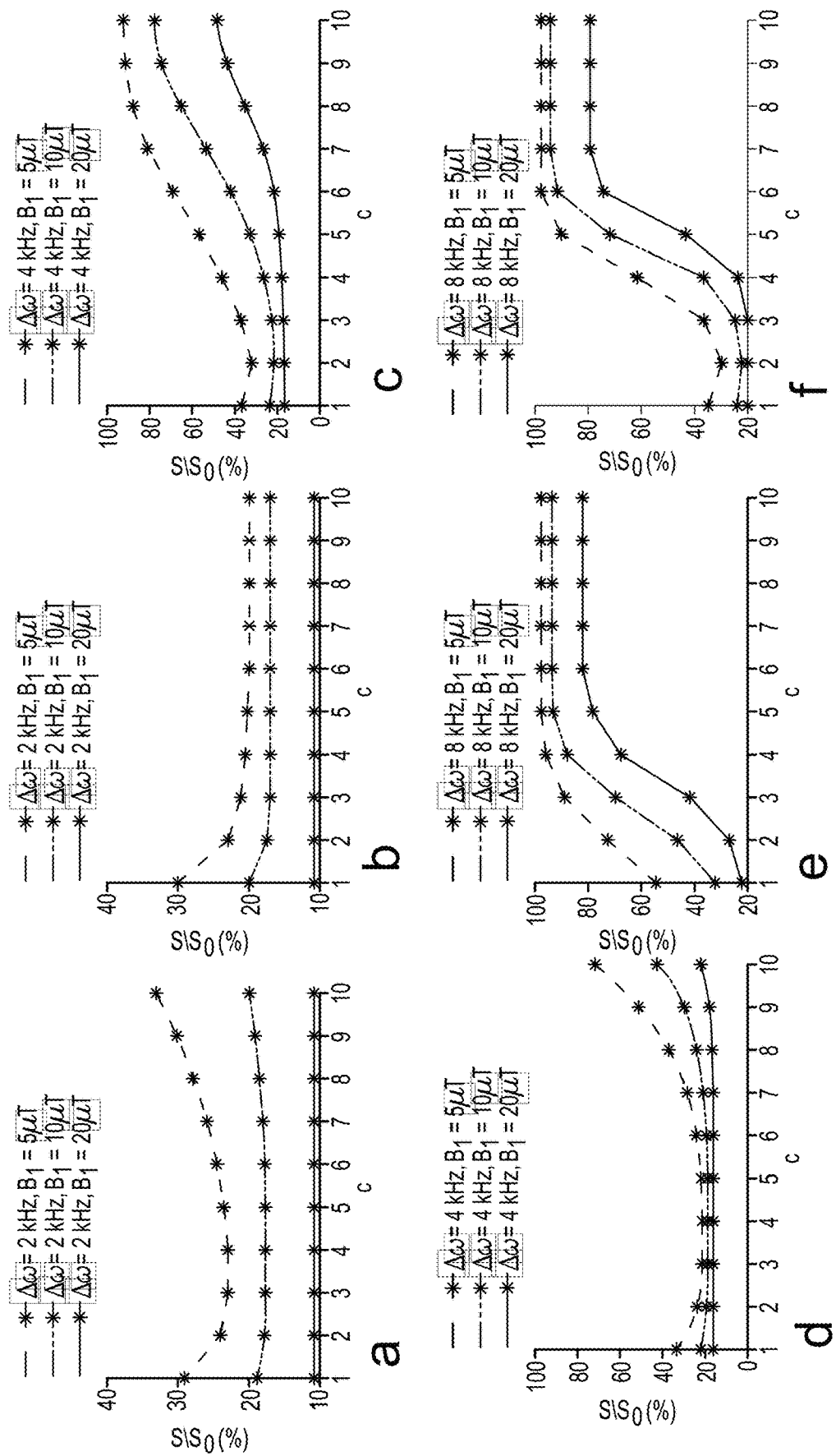
FIG. 18 shows calculated S(c$\Delta\omega$, c$\omega$1)/S$_0$ vs. c with $\Delta\omega$ of 2 kHz, 4 kHz, and 8 kHz, as well as B1 of 5 µT, 10 µT, and 20 µT for each $\Delta\omega$. Plots in (a, c, e) were calculated with the super-Lorentzian line shape, and plots in (b, d, f) were calculated with the Gaussian line shape, according to one or more embodiments.

$R_{MT}$ has a complex dependence on $\Delta\omega$ and $\omega_1$ through $W=\omega_1^2 \pi g_m(\Delta\omega)$. FIG. 16 shows that W(c$\Delta\omega$, c$\omega_1$) is usually a non-monotonic function of c. It first increases and then decreases with c values, except in the FIG. 16e. This suggests that $R_{MT}$(c$\Delta\omega$, c$\omega_1$) may also first increases and then decreases with c values by analyzing Eq. (4), and further suggests that the $S(c\Delta\omega, c\omega_1)/S_0$ may first decreases and then increases with c values by analyzing Eq. (3). FIG. 17 and FIG. 18 show the variation of the corresponding $R_{MT}(c\Delta\omega, c\omega_1)$ and $S(c\Delta\omega, c\omega_1)/S$, respectively, with different c values, confirming the analysis of Eq. (4) and Eq. (3). FIGS. 16-18 also shows that this complex dependence depends on the line shape of the macromolecular pool. The deviation of the curve with c value of 1 and $B_1$ of 5 μT at relatively low $\Delta\omega$ in FIG. 2d and FIG. 4d from other curves is caused by the complex dependence of $R_{MT}$ on $\Delta\omega$ and on. Before the dopMTR imaging, appropriate $\Delta\omega$, $\omega_1$, and c values should be chosen so that $S(\Delta\omega, \omega_1)/S_0$ and $S(c\Delta\omega, c\omega_1)/S_0$ are different. In this embodiment on animals, high saturation powers (i.e., 5 μT-50 μT) were used. However, relatively lower saturation powers (i.e., 1 μT-5 μT) can be alternatively used in the dopMTR so that it can be translated to human imaging.

Figure 9:
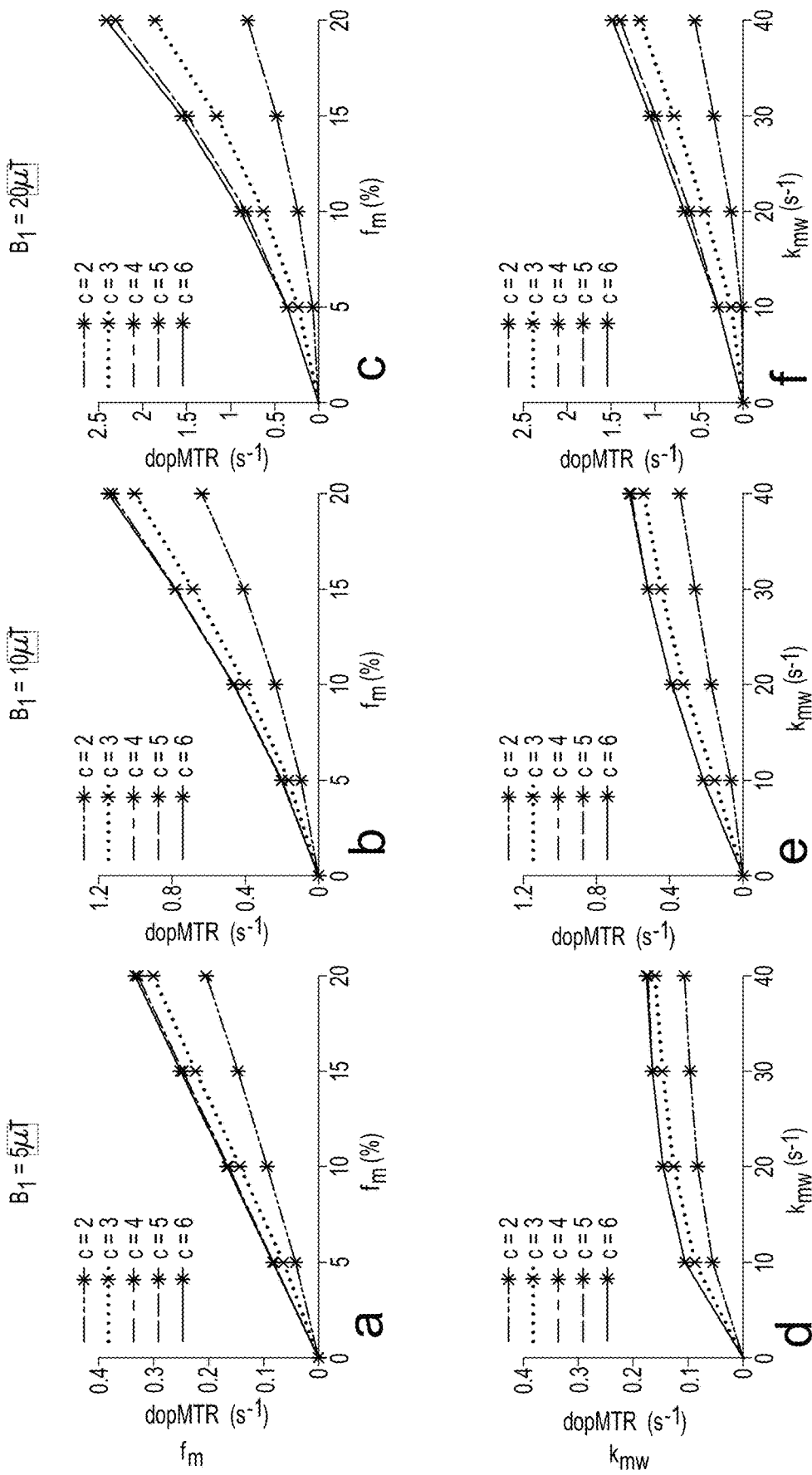
FIG. 9 shows a two-pool model simulated dopMTR(c$\Delta\omega$, c$\omega$1) values as a function of fm (a, b, c), kmw (d, e, f), T1w (g, h, i), and T2w (j, k, l) with Aw of 8 kHz, B1 of 5 µl', 10 µT and 20 µT, and t of 0.5 s, according to one or more embodiments.
Figure 9:
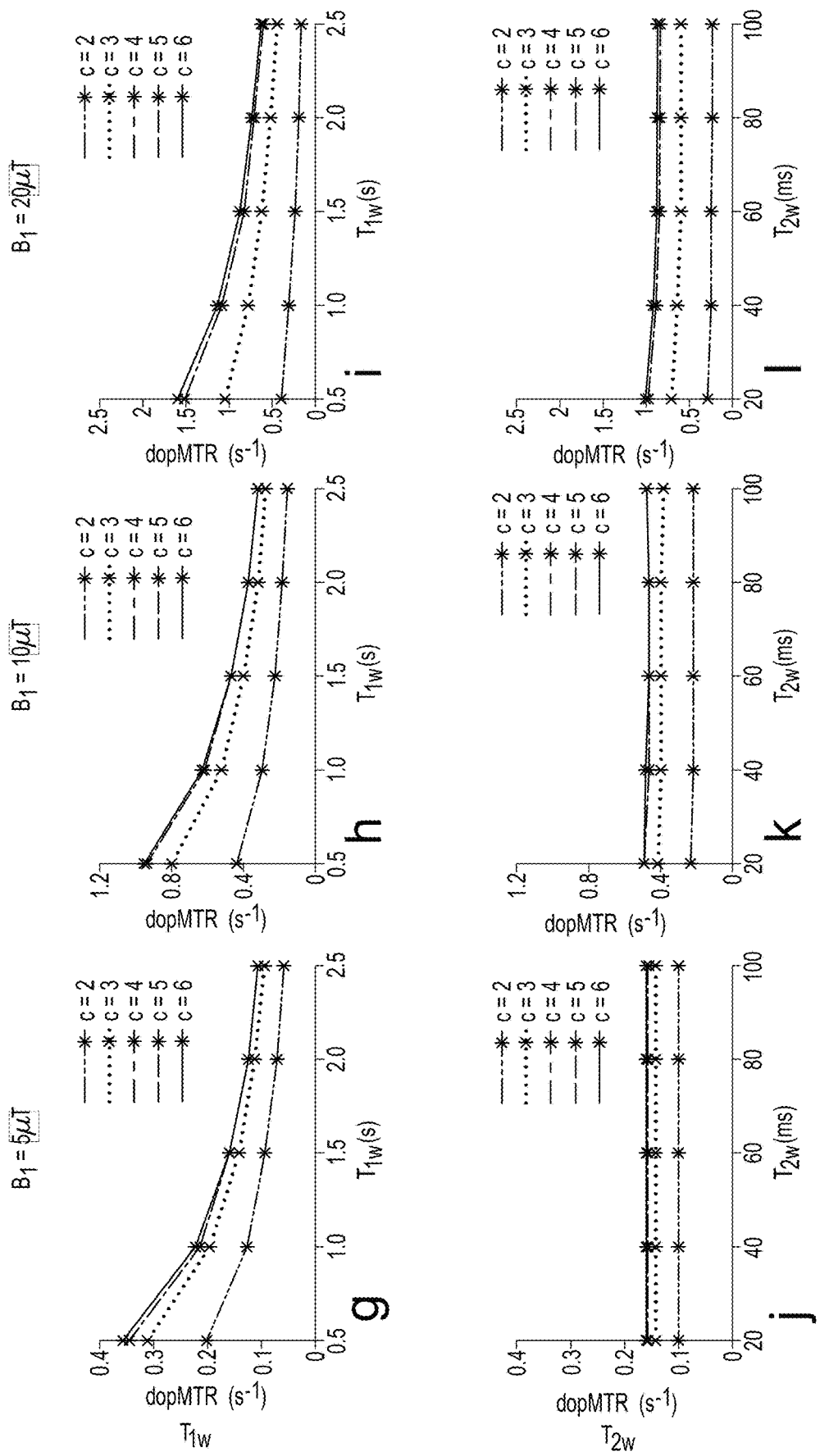
Figure 10:
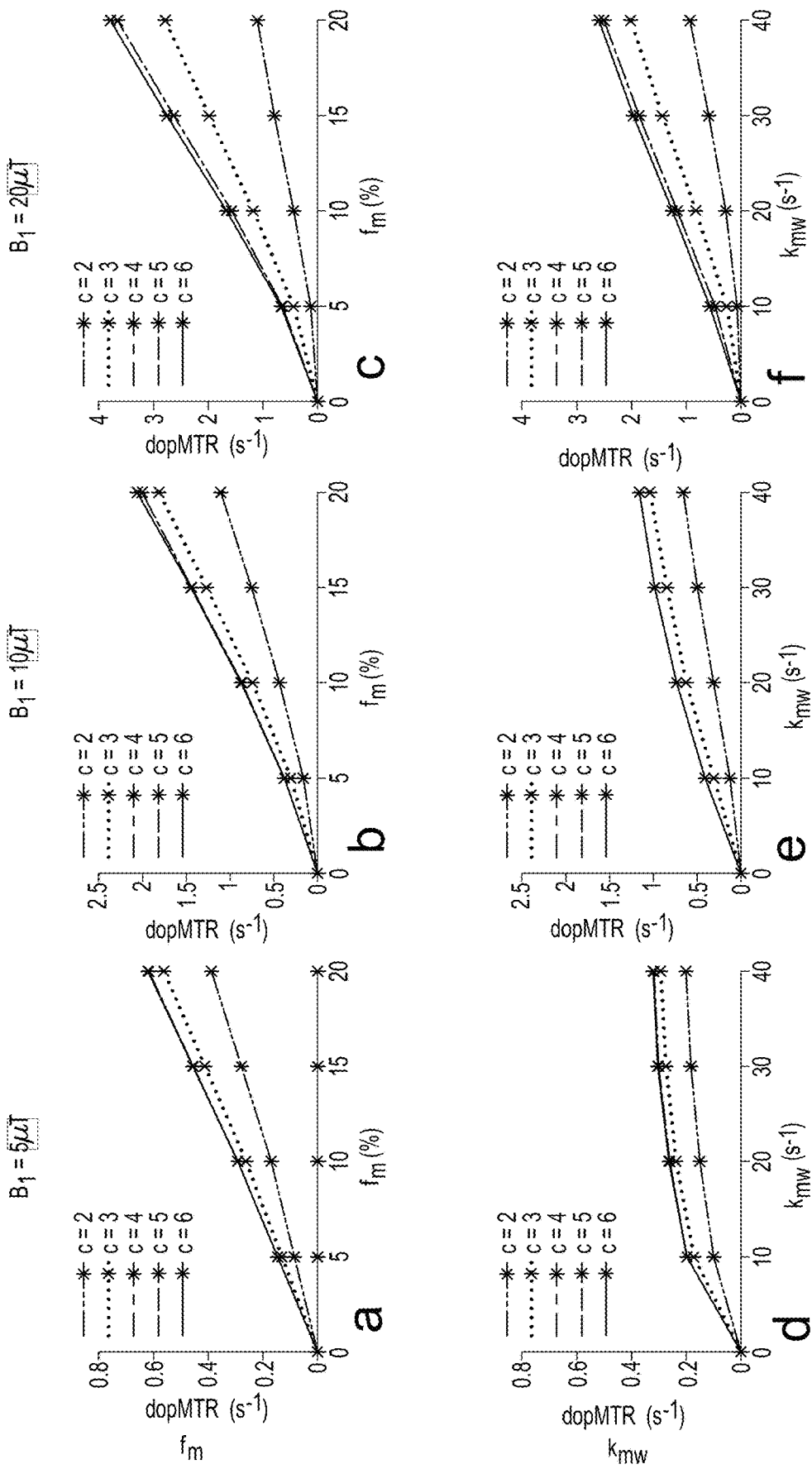
FIG. 10 shows a two-pool model simulated dopMTR (c$\Delta\omega$, c$\omega$1) values as a function of fin (a, b, c), kmw (d, e, f), T1w (g, h, i), and T2w (j, k, l) with Aw of 8 kHz, B1 of 5 µT, 10 µT and 20 µT, and t of 1 s, according to one or more embodiments.
Figure 10:
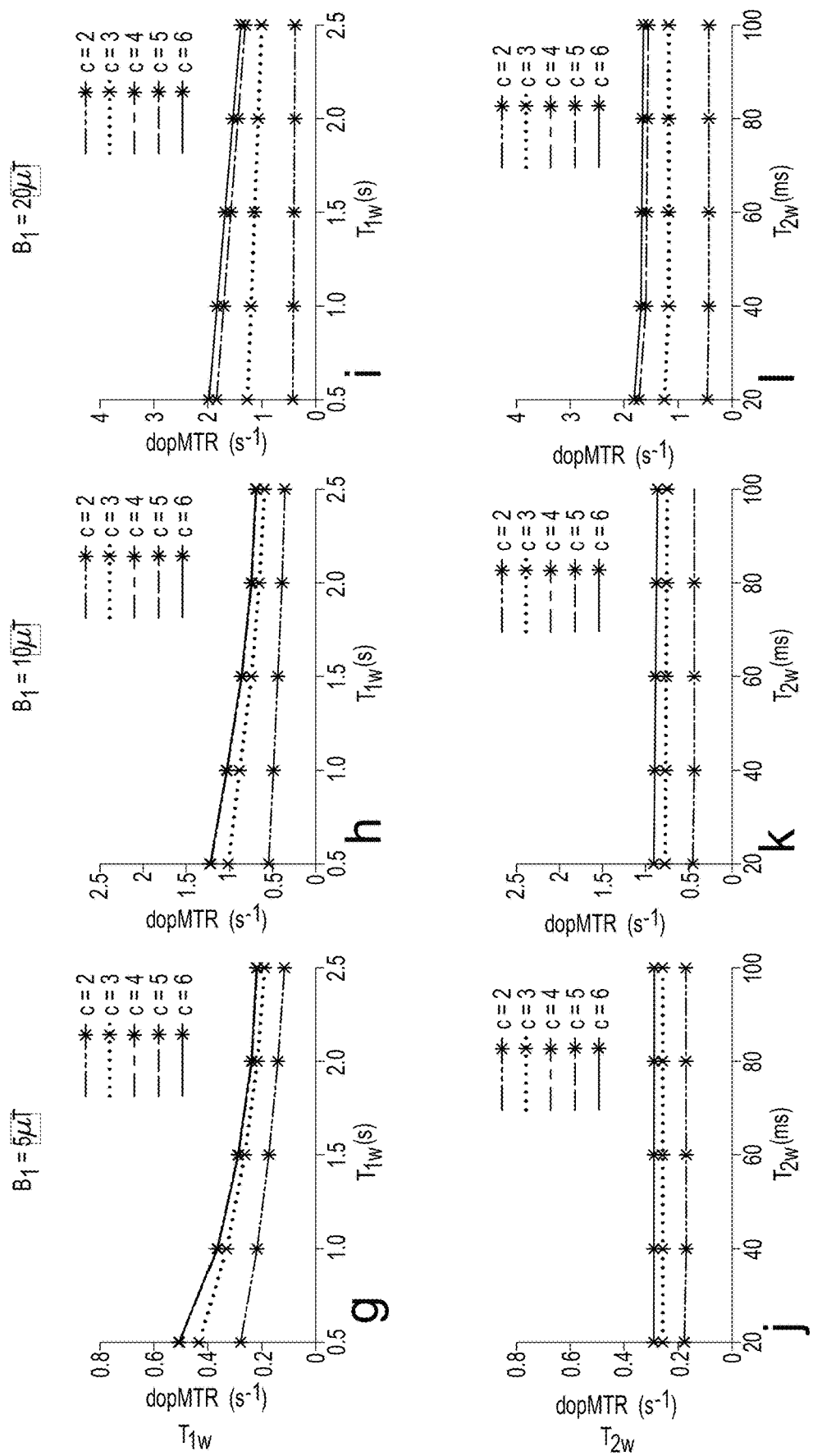
Figure 11:
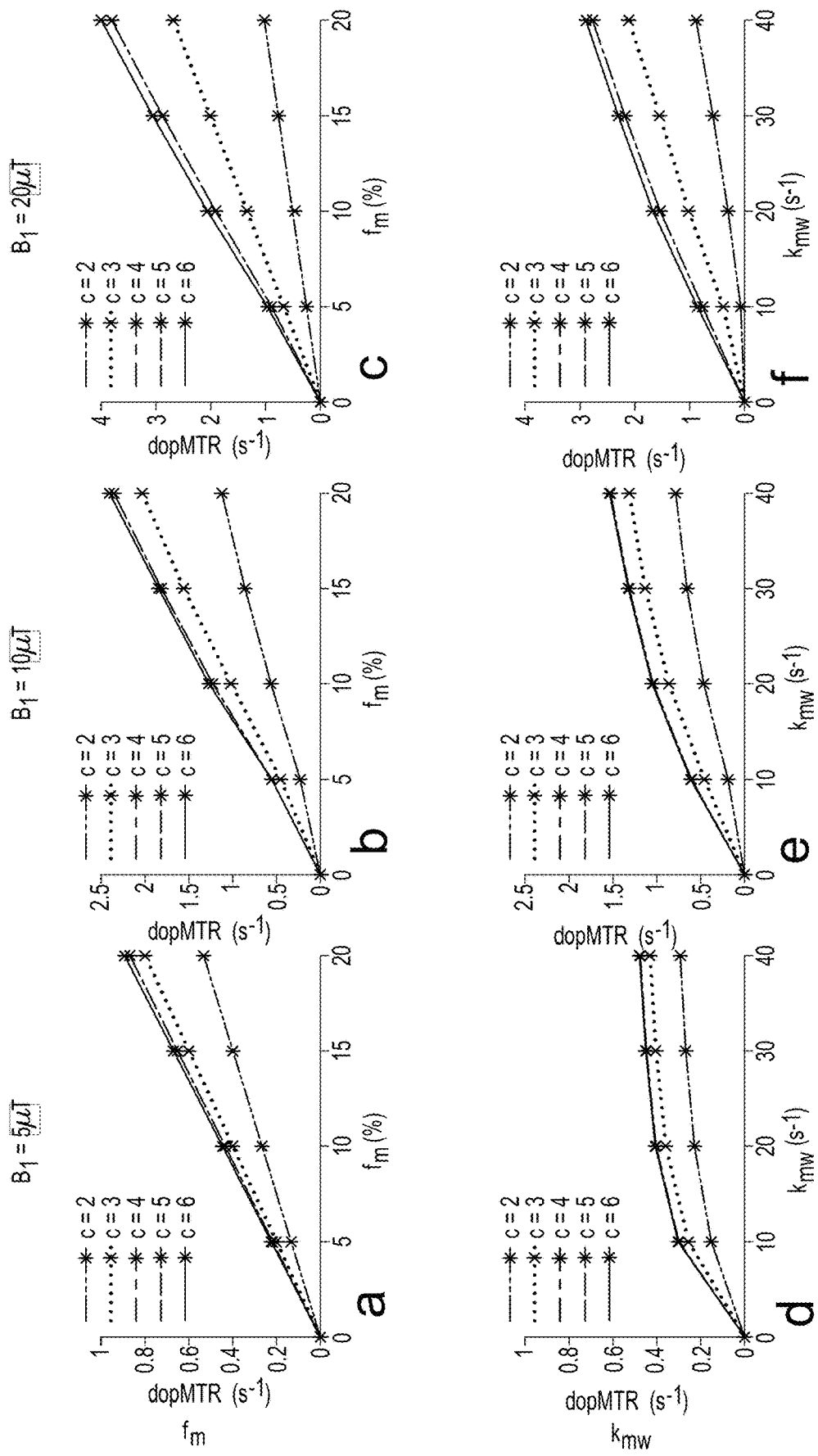
FIG. 11 shows a two-pool model simulated dopMTR (c$\Delta\omega$, c$\omega$1) values as a function of fm (a, b, c), kmw (d, e, f), T1w (g, h, i), and T2w (j, k, l) with Aw of 8 kHz, B1 of 5 µT, 10 µT and 20 µT, and t of 2 s, according to one or more embodiments.
Figure 11:
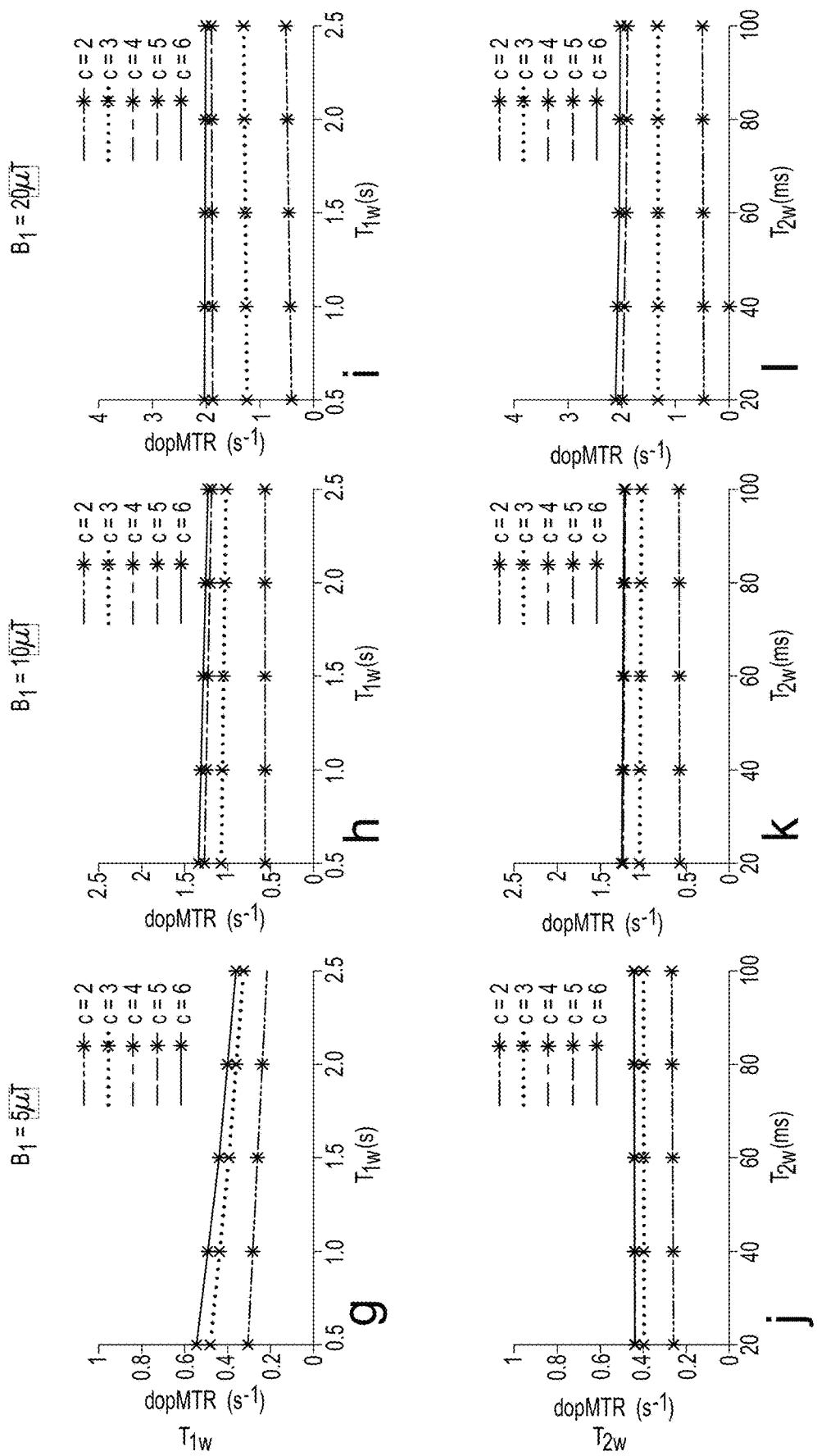
Figure 12:
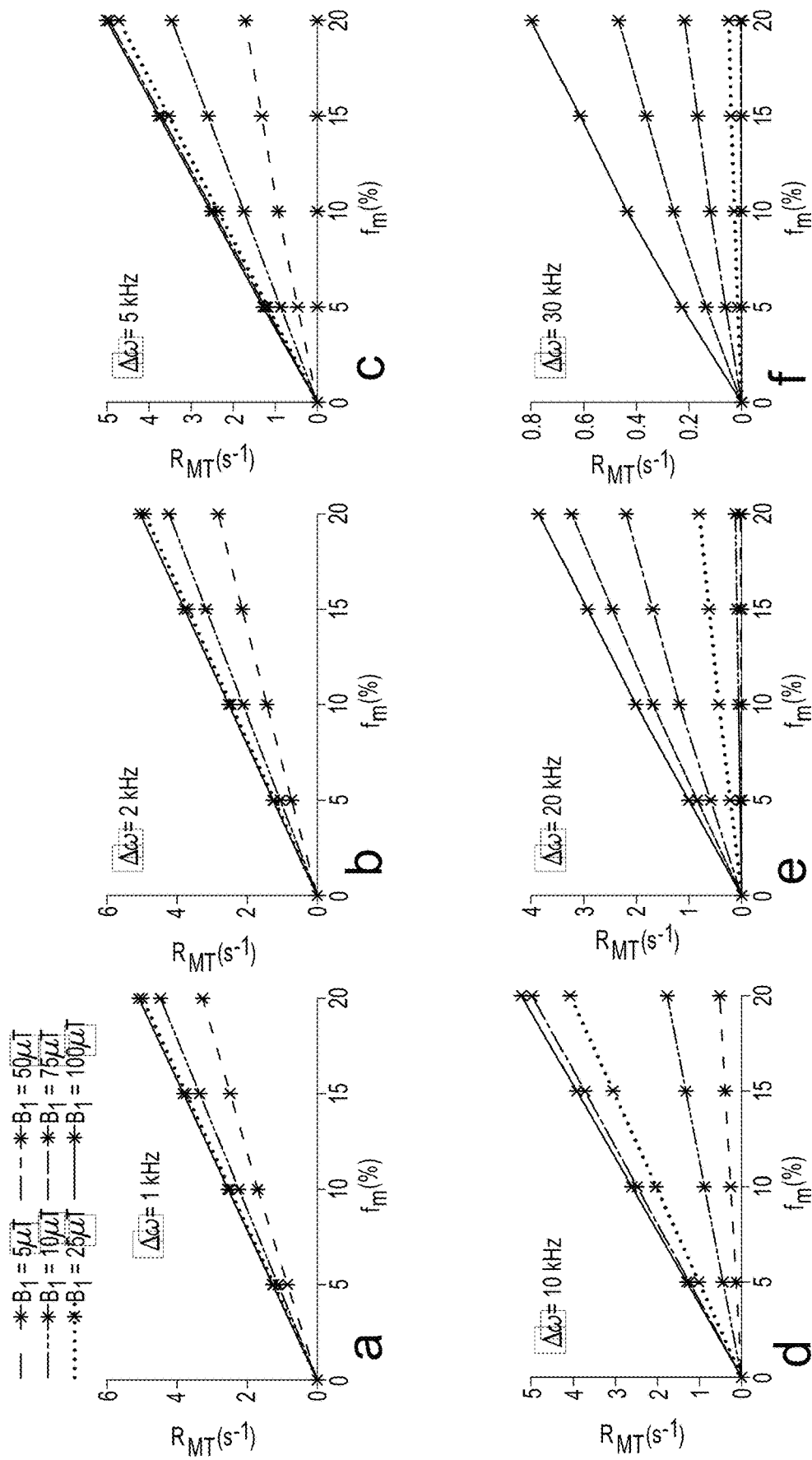
FIG. 12 shows calculated RMT($\Delta\omega$, $\omega$1) vs. fm with Aw of 1 kHz (a, i), 2 kHz (b, j), 5 kHz (c, k), 10 kHz (d, l), 20 kHz (e, m), 40 kHz (f, n), 70 kHz (g, o), and 100 kHz (h, p), as well as B1 of 5 µT, 10 µT, 25 µT, 50 µl', 75 µT, and 100 µT for each $\Delta\omega$. RMT values were calculated using Eq. (4) and sample parameters listed in Table 1. Plots in (a-h) and in (i-p) were simulated with a Super-Lorentzian line shape and a Gaussian line shape, respectively, according to one or more embodiments.
Figure 12:
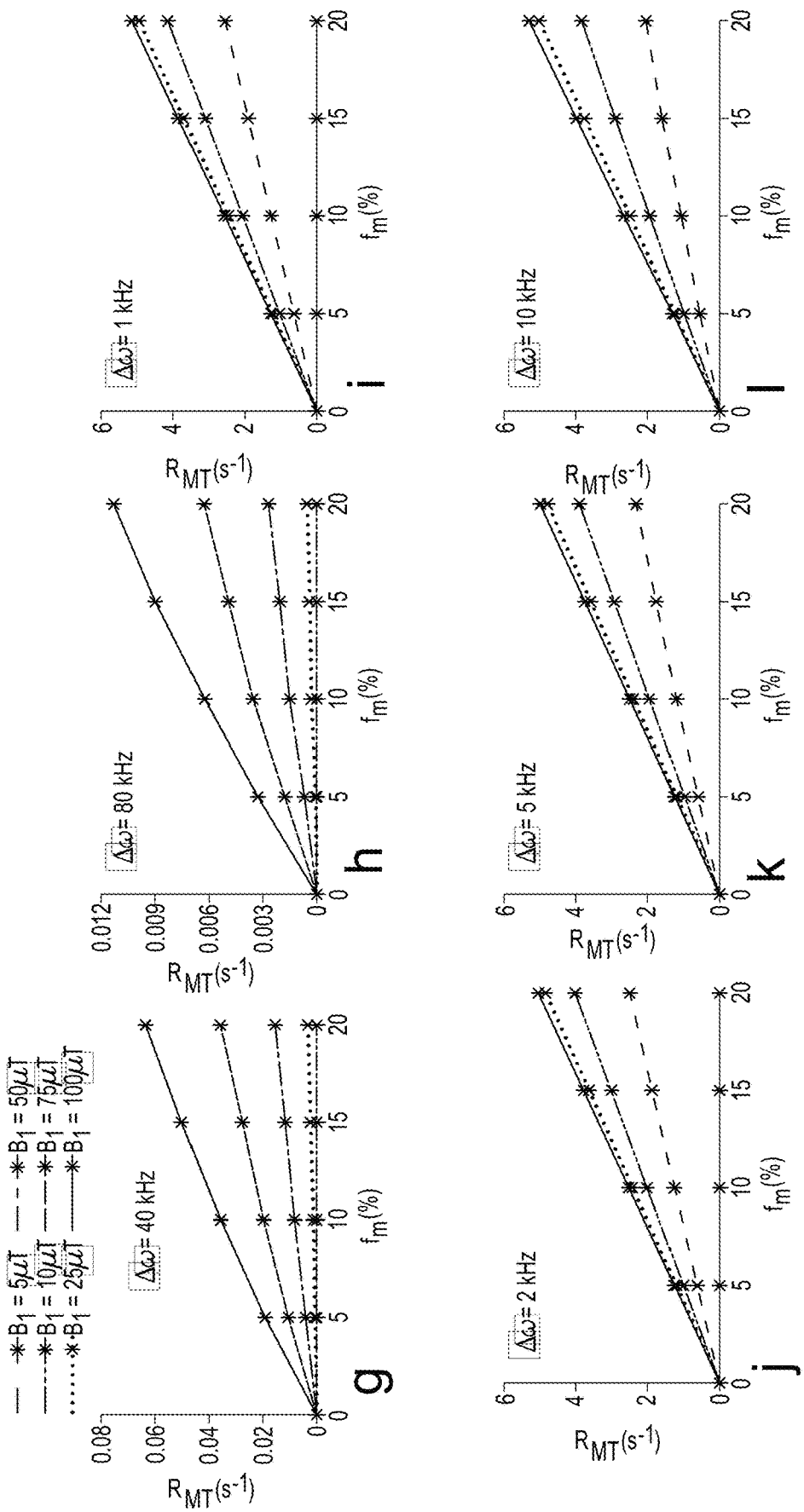
Figure 12:
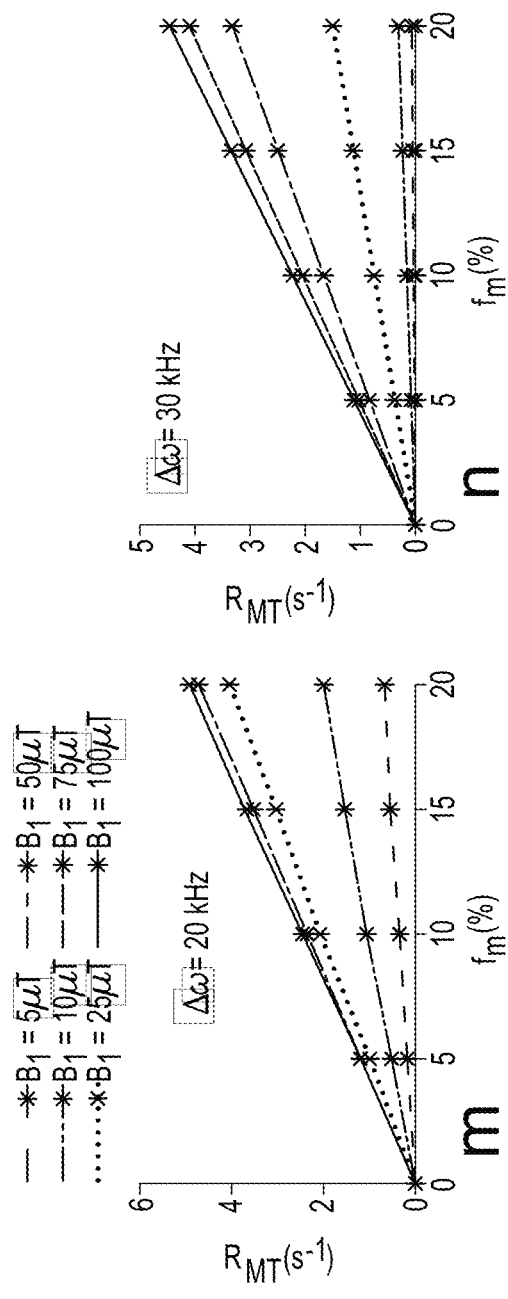
Figure 12:
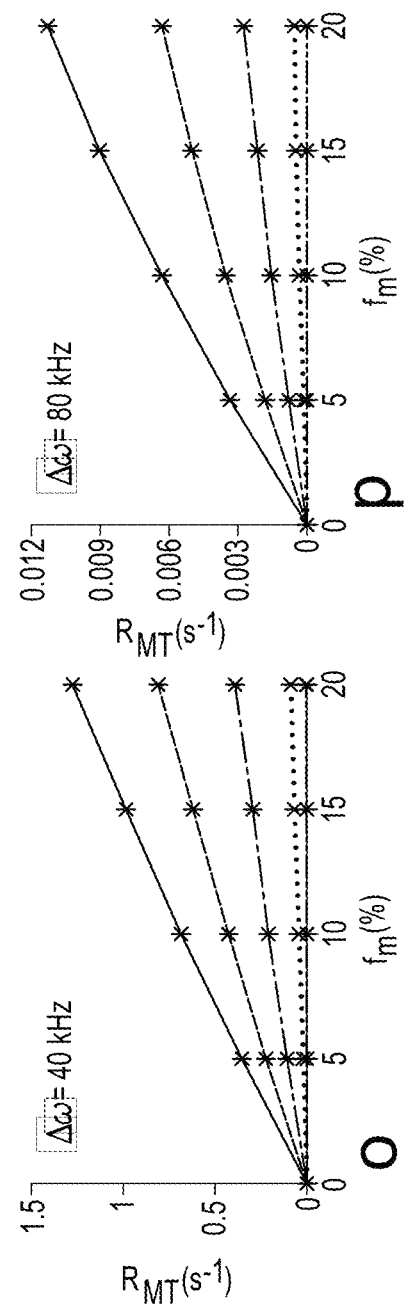
Figure 13:
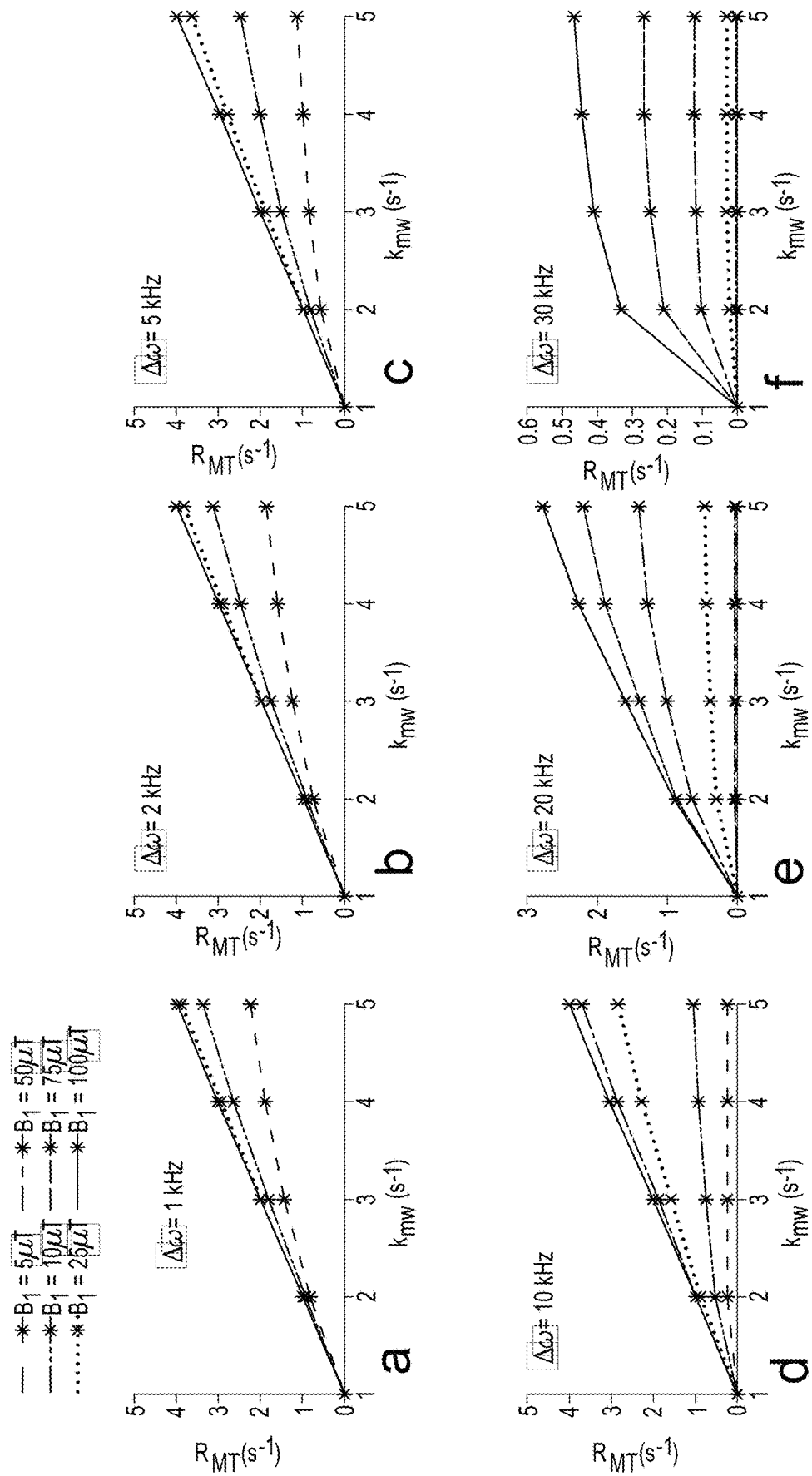
FIG. 13 shows calculated RMT($\Delta\omega$, $\omega$1) vs. ksw with $\Delta\omega$ of 1 kHz (a, i), 2 kHz (b, j), 5 kHz (c, k), 10 kHz (d, l), 20 kHz (e, m), 40 kHz (f, n), 70 kHz (g, o), and 100 kHz (h, p), as well as B1 of 5 µT, 10 µT, 25 µT, 50 µT, 75 µT, and 100 µT for each $\Delta\omega$. RMT values were calculated using Eq. (4) and sample parameters listed in Table 1. Plots in (a-h) and in (i-p) were simulated with a Super-Lorentzian line shape and a Gaussian line shape, respectively, according to one or more embodiments.
Figure 13:
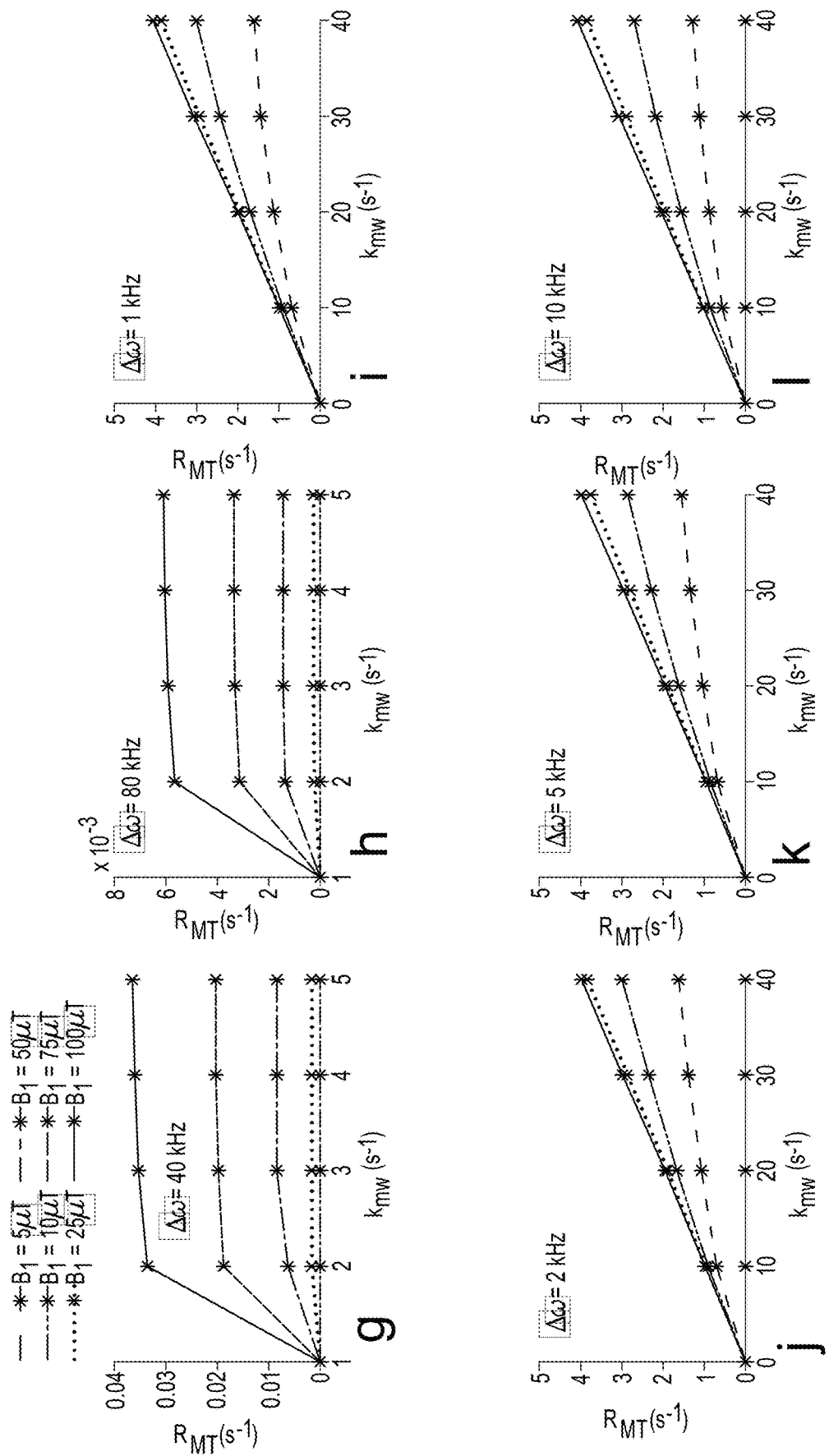
Figure 13:
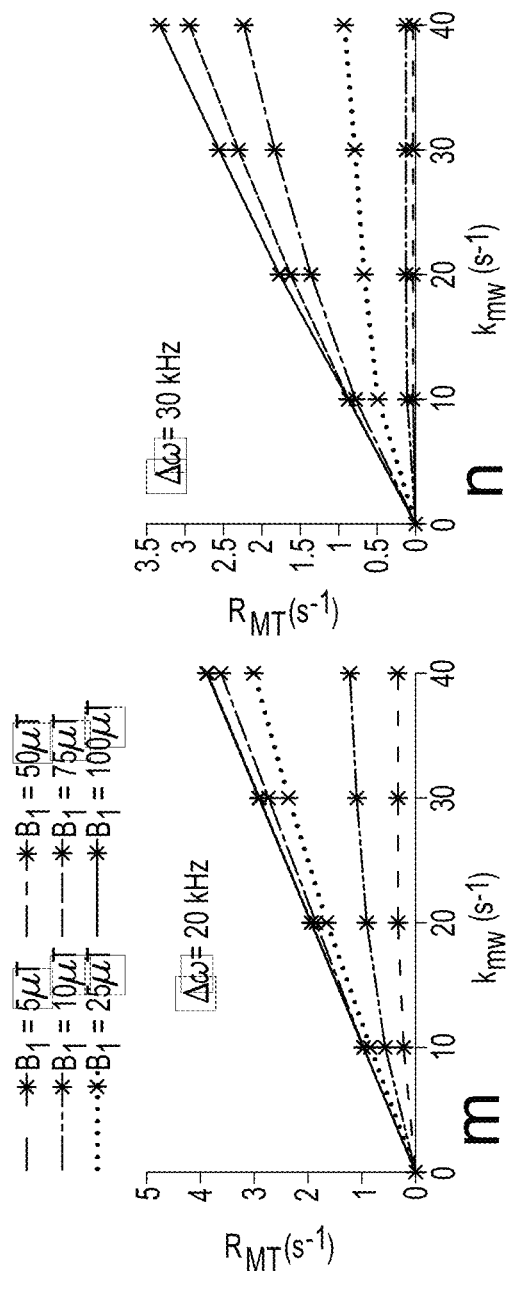
Figure 13:
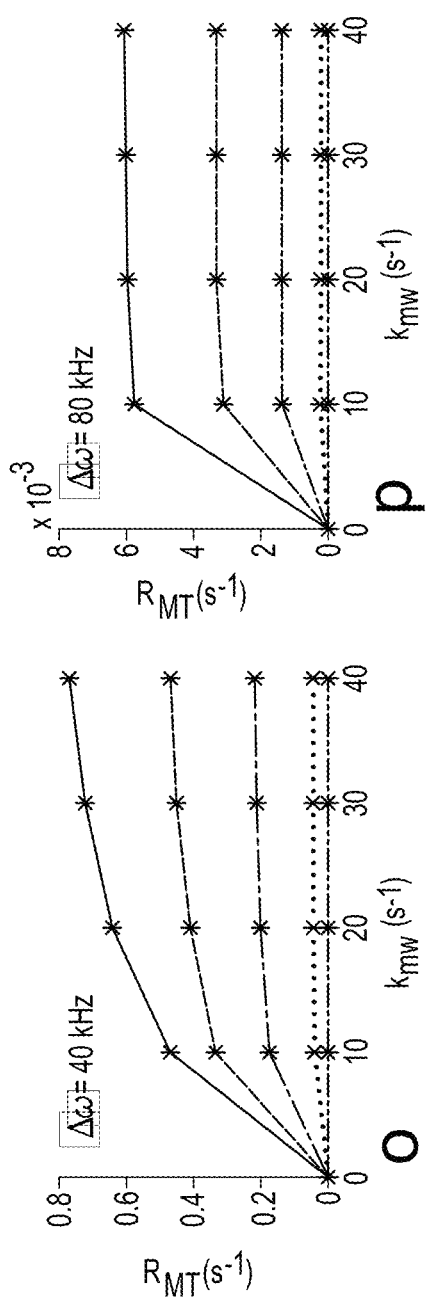
Figure 14:
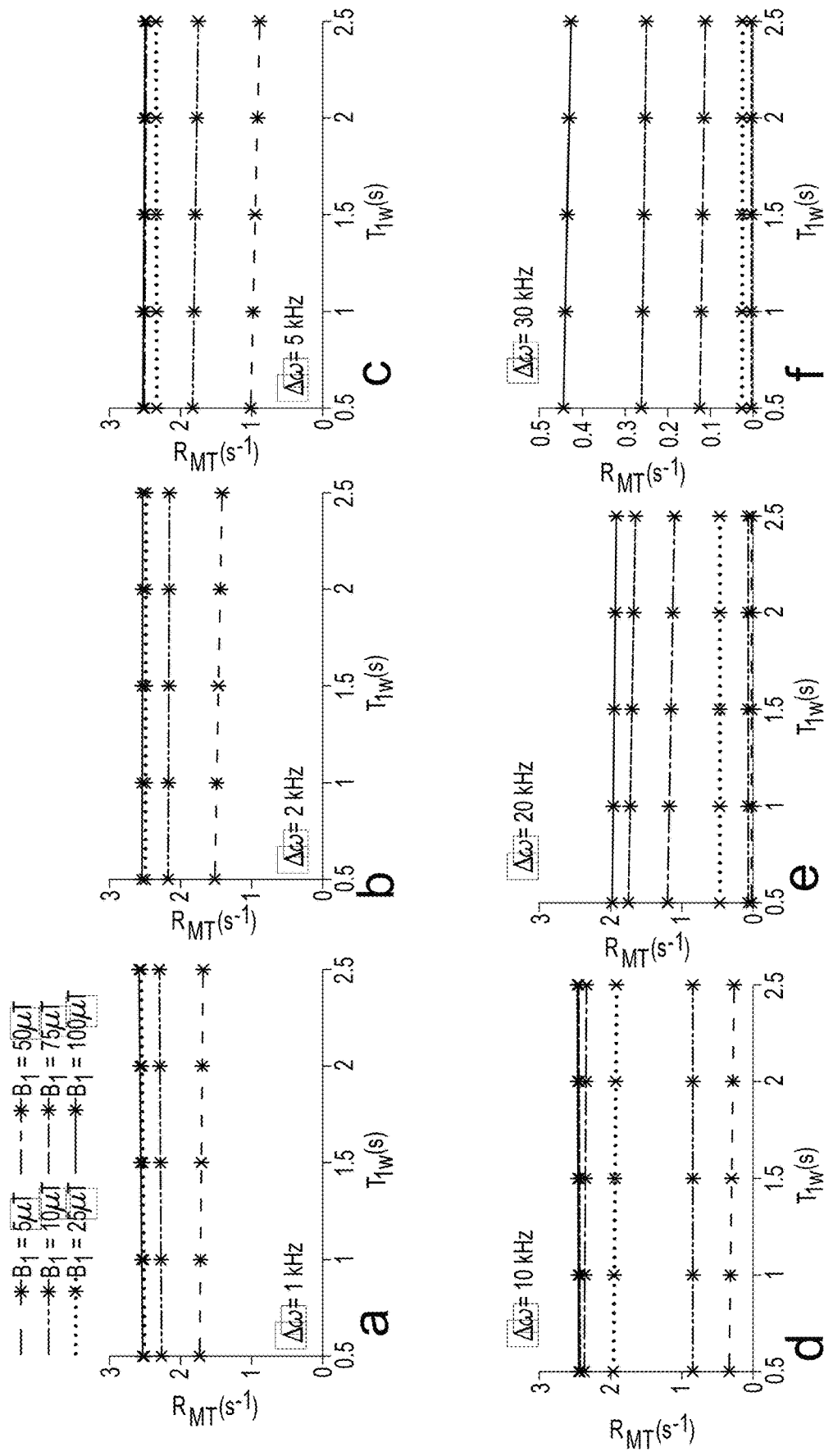
FIG. 14 shows calculated RMT($\Delta\omega$, $\omega$1) vs. T1w with $\Delta\omega$ of 1 kHz (a, i), 2 kHz (b, j), 5 kHz (c, k), 10 kHz (d, l), 20 kHz (e, m), 40 kHz (f, n), 70 kHz (g, o), and 100 kHz (h, p), as well as B1 of 5 µT, 10 µT, 25 µT, 50 µT, 75 µT, and 100 µT for each $\Delta\omega$. RMT values were calculated using Eq. (4) and sample parameters listed in Table 1. Plots in (a-h) and in (i-p) were simulated with a Super-Lorentzian line shape and a Gaussian line shape, respectively, according to one or more embodiments.
Figure 14:
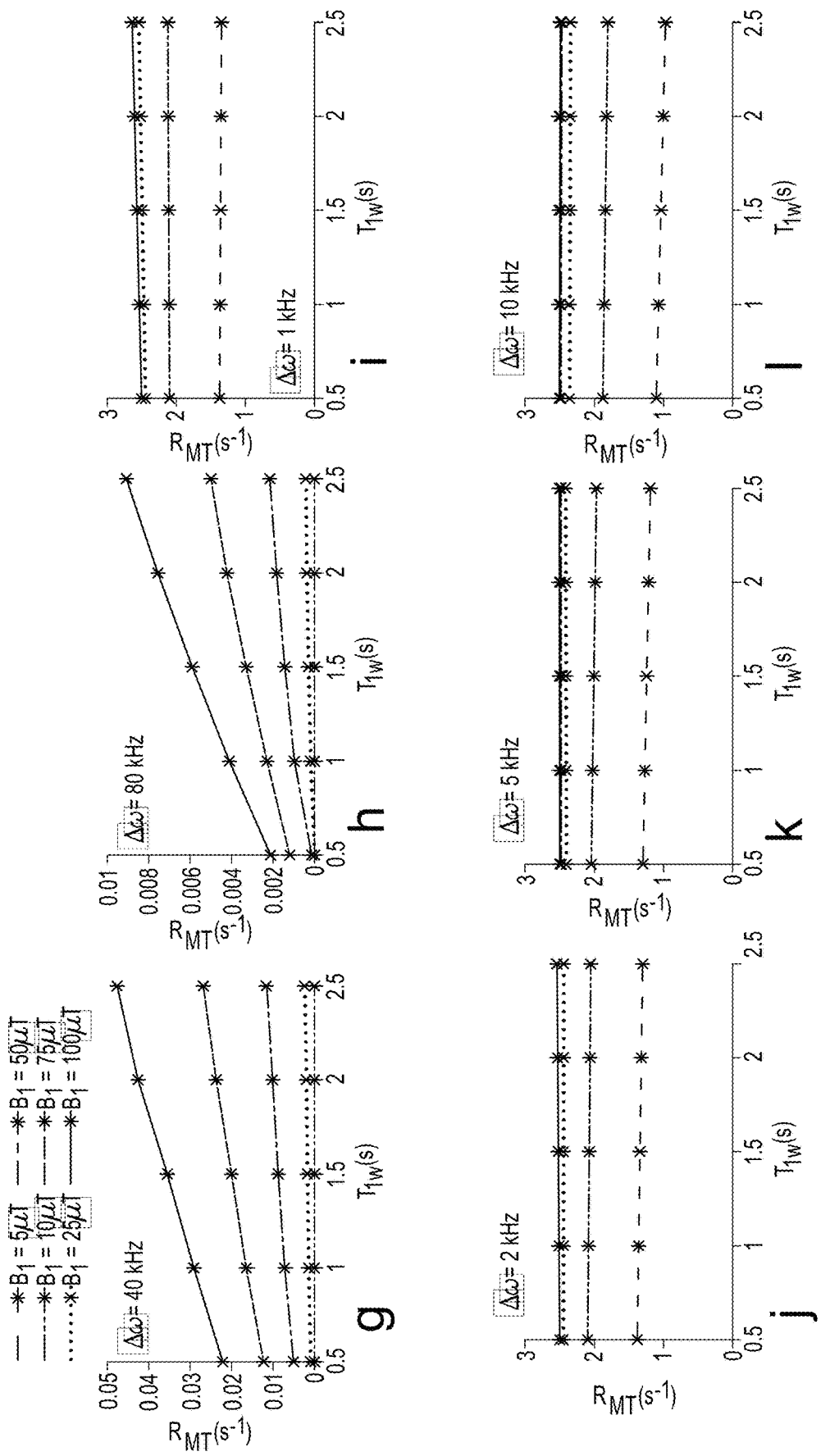
Figure 14:
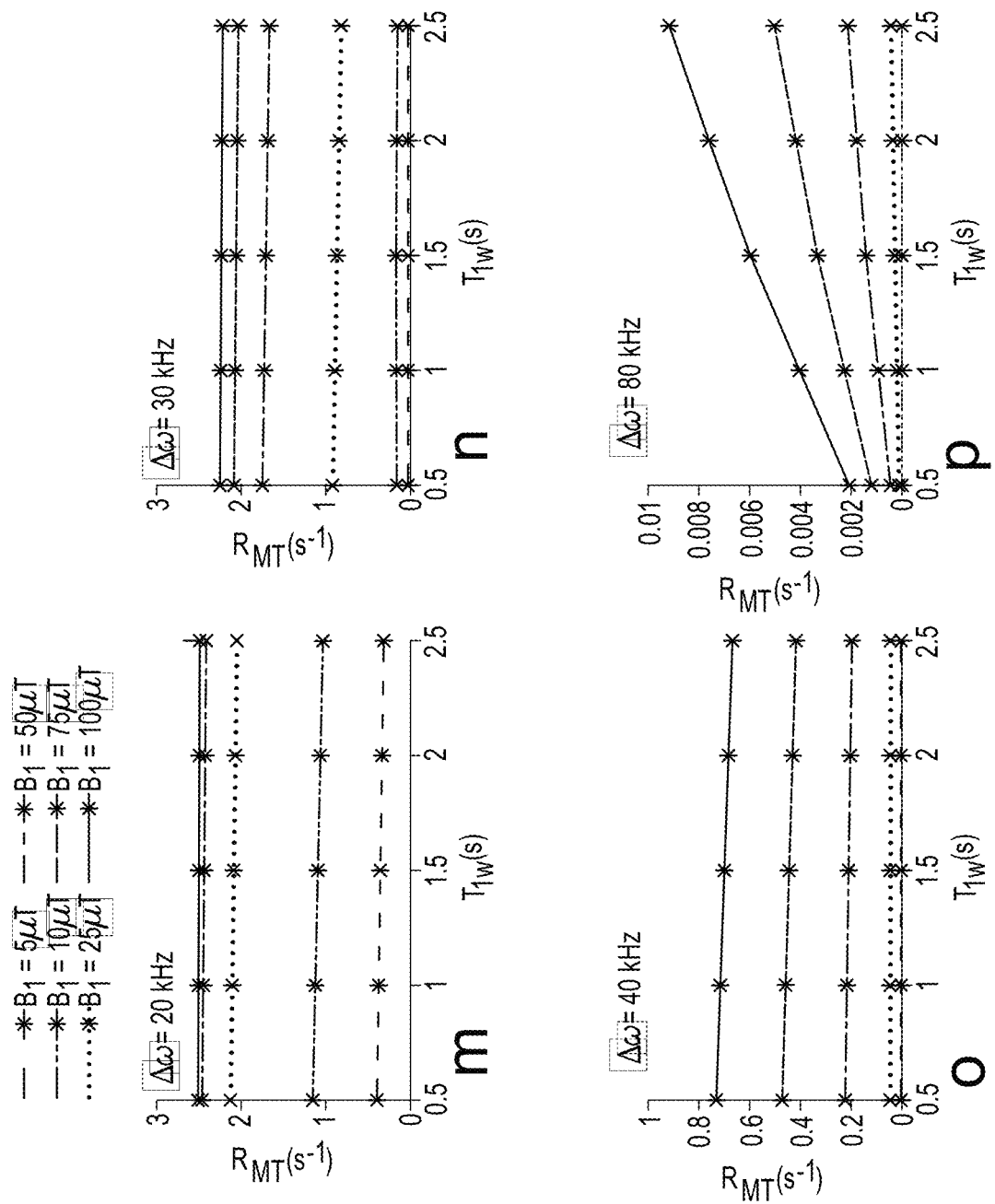
Figure 15:
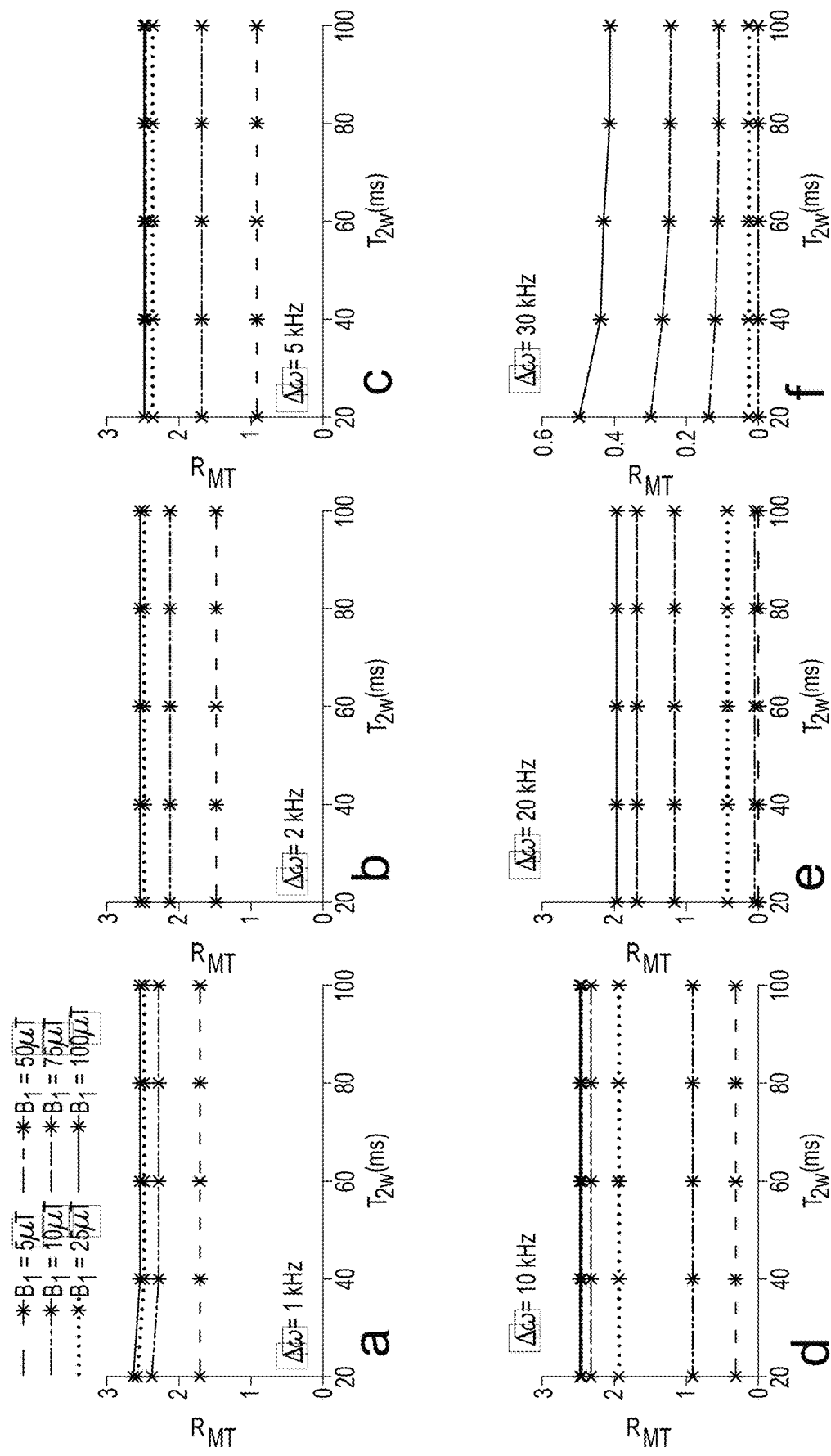
FIG. 15 shows calculated RMT($\Delta\omega$, $\omega$1) vs. T2w with $\Delta\omega$ of 1 kHz (a, i), 2 kHz (b, j), 5 kHz (c, k), 10 kHz (d, l), 20 kHz (e, in), 40 kHz (f, n), 70 kHz (g, o), and 100 kHz (h, p), as well as B1 of 5 µT, 10 µT, 25 µT, 50 µT, 75 µT, and 100 µT for each $\Delta\omega$. RMT values were calculated using Eq. (4) and sample parameters listed in Table 1. Plots in (a-h) and in (i-p) were simulated with a Super-Lorentzian line shape and a Gaussian line shape, respectively, according to one or more embodiments.
Figure 15:
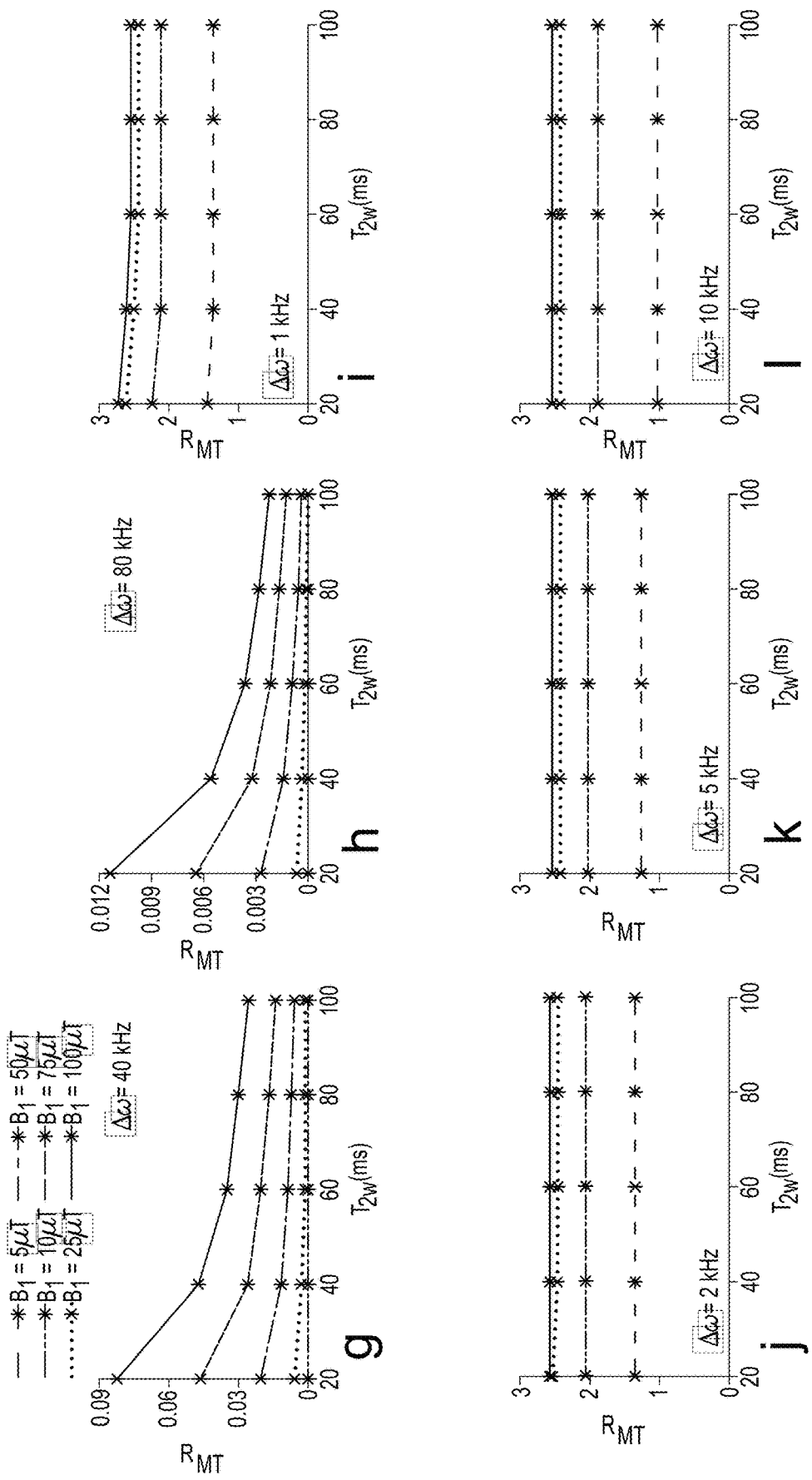
Figure 15:
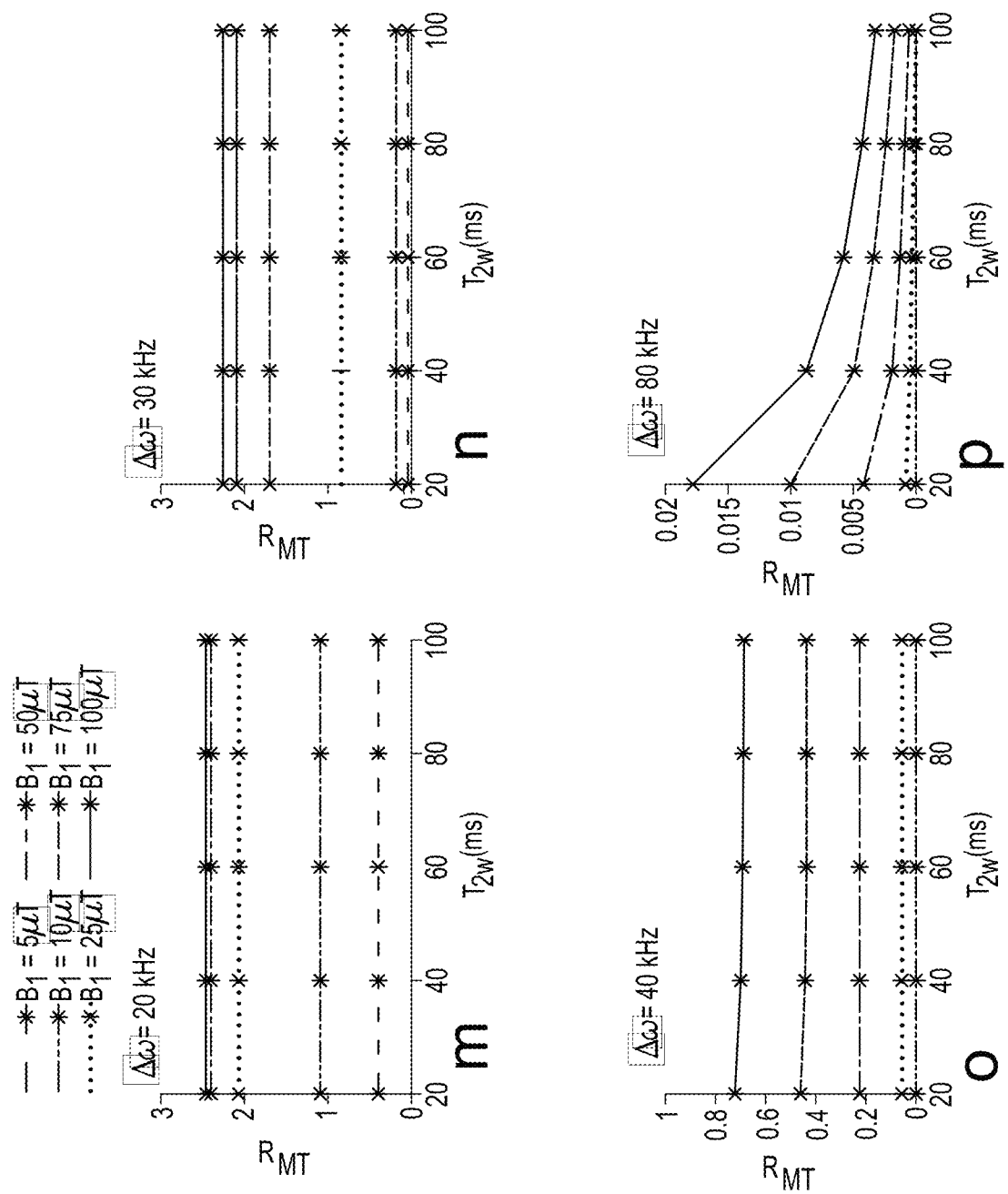

Our theoretical analysis and simulations about the low sensitivity and specificity of the conventional MTR, as well as the development of the dopMTR are based on acquisition of steady-state MT signals. In non-steady-state imaging with very short saturation time (e.g. t=0.5 s and 1 s), the dopMTR cannot remove $R_{1w}$ (see FIG. 9 and FIG. 10). However, with the increase of the saturation time (e.g. t=2 s), the dopMTR becomes relatively insensitive to $R_{1w}$ (see FIG. 11).

5. CONCLUSIONS

The techniques described herein overcome the low specificity and low sensitivity of the conventional MTR that has been used to measure and analyze MT effect. The most likely product employing this improved technique would involve an improved MT MRI imaging sequence that can improve the diagnostic capability of current MRI scanners in neuroimaging. Further, DopMTR needs relatively brief acquisition and is easy to calculate. It provides similar contrast to qMT determined $f_m$, but with significantly reduced imaging time.

The method steps in any of the embodiments described herein are not restricted to being performed in any particular order. Also, structures or systems mentioned in any of the method embodiments may utilize structures or systems mentioned in any of the device/system embodiments. Such structures or systems may be described in detail with respect to the device/system embodiments only but are applicable to any of the method embodiments.

Features in any of the embodiments described in this disclosure may be employed in combination with features in other embodiments described herein, such combinations are considered to be within the spirit and scope of the present disclosure.

The contemplated modifications and variations specifically mentioned in this disclosure are considered to be within the spirit and scope of the present disclosure.

More generally, even though the present disclosure and exemplary embodiments are described above with reference to the examples according to the accompanying drawings, it is to be understood that they are not restricted thereto. Rather, it is apparent to those skilled in the art that the disclosed embodiments can be modified in many ways without departing from the scope of the disclosure herein. Moreover, the terms and descriptions used herein are set forth by way of illustration only and are not meant as limitations. Those skilled in the art will recognize that many variations are possible within the spirit and scope of the disclosure as defined in the following claims, and their equivalents, in which all terms are to be understood in their broadest possible sense unless otherwise indicated.

What is claimed is:

1. A method for measuring magnetization transfer (MT) of magnetic resonance (MR) signals, the method comprising:
   providing a first MT sequence and a second MT sequence, each comprising a radiofrequency (RF) saturation block, wherein:
   the first MT sequence comprises a predetermined first RF saturation power and a predetermined first RF saturation frequency offset from water,
   the second MT sequence comprises a second RF saturation power and a second RF saturation frequency offset from water,
   the second RF saturation power is greater than the first RF saturation power by a factor c, and
   the second RF saturation frequency offset is greater than the first saturation frequency offset by the factor c;
   acquiring a first MR signal and a second MR signal using the first MT sequence and the second MT sequence; and
   measuring the MT via a difference between the first MR signal and the second MR signal.

2. The method of claim 1, wherein the RF saturation block comprises either
   (1) a single continuous wave (CW) saturation pulse followed by imaging readout;
   (2) a train of shorter saturation pulses followed by imaging readout;
   (3) a train of shorter saturation pulses with interleaved imaging readout; or
   (4) a train of shorter saturation pulses for MT saturation followed by another train of shorter saturation pulses with interleaved imaging readout for both MT saturation and data acquisition.

3. The method of claim 1, wherein the factor c is a rational number.

4. The method of claim 1, further comprising:
   subtracting or inverse subtracting the first MR signal and the second MR signal; and
   determining an MT effect using the subtracting or inverse subtracting of the first MR signal and the second MR signal.

5. The method of claim 4, wherein determining the MT effect comprises using normalization by water longitudinal relaxation time.

6. The method of claim 1, wherein the first and second MT sequence have a duration between 50 ms and 20 s, and the RF saturation block of the first and second MT sequence is an off-resonance CW-RF saturation block followed by an imaging readout.

7. The method of claim 1, wherein the first and second MT sequence have a duration between 5 ms and 2 s, and comprise a train of off-resonance saturation pulses followed by an imaging readout.

8. The method of claim 7, wherein the duration between two adjacent saturation pulses is between 0 s and 1 s.

9. The method of claim 7, wherein the number of saturation pulses is between 1 and 1000.

10. The method of claim 7, wherein the shape of the saturation pulses is rectangular, Gaussian, SINC, or any variation of rectangular, Gaussian, or SINC.

11. The method of claim 1, wherein the first and second MT sequence
   have a duration between 5 ms to 2 s, and
   comprise a train of off-resonance saturation pulses with interleaved imaging readout between two adjacent saturation pulses.

12. The method of claim 11, wherein the duration between two adjacent saturation pulses is between 0 s and 1 s.

13. The method of claim 11, wherein the number of saturation pulses is between 1 and 1000.

14. The method of claim 11, wherein the shape of the saturation pulses is rectangular, Gaussian, SINC, or any variation of rectangular, Gaussian, and SINC.

15. The method of claim 1, wherein the first and second MT sequence
   have a duration between 5 ms and 2 s, and
   comprise a first train of off-resonance saturation pulses followed by a second train of off-resonance saturation pulses with a duration between 5 ms and 2 s with interleaved imaging readout between two adjacent saturation pulses.

16. The method of claim 15, wherein the duration between the two adjacent saturation pulses is between 0 s and 1 s.

17. The method of claim 15, wherein the number of saturation pulses is between 1 and 1000.

18. The method of claim 15, wherein the shape of the saturation pulses is rectangular, Gaussian, SINC, or any variation of rectangular, Gaussian, and SINC.

19. A magnetic resonance imaging scanner that measures the MT of MR signals according to the method of any of the previous claims.

* * * * *